United States Patent
Eom et al.

(10) Patent No.: US 12,254,942 B2
(45) Date of Patent: Mar. 18, 2025

(54) CONTROL METHOD, SEMICONDUCTOR MEMORY, AND ELECTRONIC DEVICE

(71) Applicant: CHANGXIN MEMORY TECHNOLOGIES, INC., Hefei (CN)

(72) Inventors: Yoonjoo Eom, Hefei (CN); Lin Wang, Hefei (CN); Zhiqiang Zhang, Hefei (CN); Yuanyuan Gong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 142 days.

(21) Appl. No.: 18/156,133

(22) Filed: Jan. 18, 2023

(65) Prior Publication Data
US 2023/0307083 A1   Sep. 28, 2023

Related U.S. Application Data

(63) Continuation of application No. PCT/CN2022/093935, filed on May 19, 2022.

(30) Foreign Application Priority Data

Mar. 25, 2022  (CN) .......................... 202210306571.2
May 9, 2022    (CN) .......................... 202210501554.4

(51) Int. Cl.
   *G11C 29/50*  (2006.01)

(52) U.S. Cl.
   CPC .................. *G11C 29/50008* (2013.01); *G11C 2029/5002* (2013.01)

(58) Field of Classification Search
   CPC ...... G11C 29/50008; G11C 2029/5002; G11C 29/022; G11C 7/1045; G11C 11/4096; G11C 29/56

(Continued)

(56) References Cited

U.S. PATENT DOCUMENTS 7,707,469 B2   4/2010   Lee
8,804,448 B2   8/2014   Park
(Continued)

FOREIGN PATENT DOCUMENTS

CN   103378826 A   10/2013
CN   103780257 A   5/2014
(Continued)

OTHER PUBLICATIONS

Micron, DDR5 SDRAM Product Core Data Sheet, Rev. C, Oct. 2021, 529 pages.
(Continued)

*Primary Examiner* — Huan Hoang
(74) *Attorney, Agent, or Firm* — Kilpatrick Townsend & Stockton LLP

(57) ABSTRACT

A control method includes: decoding a third Operand (OP) in a third Mode Register (MR) and a fourth OP in a first MR; and in response to the semiconductor memory being in a preset test mode, controlling, in a case where the third OP meets a first decoding condition, the impedance of a Data Mask (DM) pin to be a first value; or controlling, in a case where the third OP meets a second decoding condition, the impedance of the DM pin to be a second value according to the fourth OP; wherein the third OP is configured to indicate whether the DM pin is a test object in the preset test mode, and the fourth OP is configured to indicate whether the DM pin is enabled.

20 Claims, 15 Drawing Sheets

(58) Field of Classification Search
USPC .......................................................... 365/201
See application file for complete search history.

(56) References Cited

U.S. PATENT DOCUMENTS

| | | |
|---|---|---|
| 2005/0007835 A1 | 1/2005 | Lee |
| 2005/0226080 A1 | 10/2005 | Lee |
| 2006/0262611 A1 | 11/2006 | Lee |
| 2007/0204185 A1 | 8/2007 | Ogura |
| 2007/0291575 A1 | 12/2007 | Lee |
| 2008/0052571 A1 | 2/2008 | Lee |
| 2008/0143377 A1 | 6/2008 | Cho et al. |
| 2009/0059680 A1 | 3/2009 | Lee |
| 2009/0122850 A1 | 5/2009 | Lee |
| 2010/0054053 A1 | 3/2010 | Lee |
| 2011/0164464 A1* | 7/2011 | Sawada ................. G11C 29/12 365/201 |
| 2011/0242918 A1 | 10/2011 | Jeong |
| 2012/0239337 A1 | 9/2012 | Matsuo |
| 2013/0049875 A1 | 2/2013 | Shiga |
| 2013/0271196 A1 | 10/2013 | Cao |
| 2013/0286759 A1* | 10/2013 | Park ..................... G11C 29/027 365/201 |
| 2014/0298125 A1 | 10/2014 | Devadze et al. |
| 2015/0016200 A1 | 1/2015 | Cha et al. |
| 2015/0084668 A1 | 3/2015 | Chang et al. |
| 2019/0052268 A1 | 2/2019 | Lee et al. |

FOREIGN PATENT DOCUMENTS

| | | |
|---|---|---|
| CN | 104113331 A | 10/2014 |
| CN | 102072781 B | 2/2015 |
| CN | 106330149 A | 1/2017 |
| CN | 106372539 A | 2/2017 |
| CN | 107393576 A | 11/2017 |
| CN | 109390011 A | 2/2019 |
| JP | 2005039549 A | 2/2005 |
| JP | 2009026359 A | 2/2009 |
| JP | 2009276174 A | 11/2009 |
| JP | 2013534014 A | 8/2013 |
| JP | 2018200739 A | 12/2018 |
| KR | 20020049386 A | 6/2002 |

OTHER PUBLICATIONS

H-K Jung et al. "A 4.35Gb/s/pin LPDDR4 I/O Interface with Multi-VOH Level, Equalization Scheme, and Duty-Training Circuit for Mobile Applications", 2015 Symposium on VLSI Circuits Digest of Technical Papers, 2 pages.
Japanese Patent Office, Office Action Issued in Application No. 2022-549059, Apr. 16, 2024, 6 pages.
United States Patent and Trademark Office, Non-Final Office action issued in related U.S. Appl. No. 18/155,124 on Sep. 11, 2024.
European Patent Office, office action issued in Application No. 22839625.5, Jan. 16, 2025, Netherlands, 4 pages.

* cited by examiner

CONTROL METHOD, SEMICONDUCTOR MEMORY, AND ELECTRONIC DEVICE

CROSS-REFERENCE TO RELATED APPLICATIONS

This application a continuation of International Application No. PCT/CN2022/093935 filed on May 19, 2022, which claims priority to Chinese Patent Application No. 202210306571.2 filed on Mar. 25, 2022 and Chinese Patent Application No. 202210501554.4 filed on May 9, 2022. The disclosures of these applications are hereby incorporated by reference in their entirety.

BACKGROUND

A Dynamic Random Access Memory (DRAM) is a semiconductor memory device commonly used in computers, at least having a data (DQ) pin and a Data Mask (DM) pin. Herein, the DQ pin has dual functions of data write and data read, and the DM pin is configured to receive an input mask signal of the write data and shield unnecessary input data during the write operation, and only supports the data write function. In the fifth edition of the memory specification (alternatively referred to as Double Data Rate 5 SDRAM (DDR5)), the impedance of the DM pin or the DQ pin needs to tested in some test modes.

SUMMARY

The present disclosure relates to the technical field of semiconductor memories, in particular to a control method, a semiconductor memory, and an electronic device.

The present disclosure provides a control method, a semiconductor memory, and an electronic device, and specifies an impedance control method for a DM pin in a preset test mode to test the impedance of the DM pin in the preset test mode and avoid circuit processing errors.

In a first aspect, embodiments of the present disclosure provide a control method, applied to a semiconductor memory. The semiconductor memory may include a DM pin, and the DM pin may be configured to receive an input mask signal of write data. The method may include the following operations. A third Operand (OP) in a third Mode Register (MR) and a fourth OP in a first MR are decoded. In response to the semiconductor memory being in a preset test mode, in a case where the third OP meets a first decoding condition, the impedance of the DM pin is controlled to be a first value. Or, in a case where the third OP meets a second decoding condition, the impedance of the DM pin is controlled to be a second value according to the fourth OP. Herein, the third OP may be configured to indicate whether the DM pin is a test object in the preset test mode, and the fourth OP may be configured to indicate whether the DM pin is enabled.

In a second aspect, the embodiments of the present disclosure provide a semiconductor memory. The semiconductor memory may include a DM pin, a first MR, a third MR, and a first driver circuit. The first driver circuit is connected with the first MR, the third MR and the DM pin respectively. The DM pin may be configured to receive an input mask signal of write data. The first driver circuit may be configured to decode a third OP in a third MR and a fourth OP in a first MR; and control, in a case where the third OP meets a first decoding condition, an impedance of the DM pin to be a first value in response to the semiconductor memory being in a preset test mode; or control, in a case where the third OP meets a second decoding condition, the impedance of the DM pin to be a second value according to the fourth OP. Herein, the third OP may be configured to indicate whether the DM pin is a test object in the preset test mode, and the fourth OP may be configured to indicate whether the DM pin is enabled.

In a third aspect, the embodiments of the present disclosure provide an electronic device, which may include a semiconductor memory. The semiconductor memory may include a DM pin, a first MR, a third MR, and a first driver circuit. The first driver circuit is connected with the first MR, the third MR and the DM pin respectively. The DM pin may be configured to receive an input mask signal of write data. The first driver circuit may be configured to decode a third OP in a third MR and a fourth OP in a first MR; and control, in a case where the third OP meets a first decoding condition, an impedance of the DM pin to be a first value in response to the semiconductor memory being in a preset test mode; or control, in a case where the third OP meets a second decoding condition, the impedance of the DM pin to be a second value according to the fourth OP. Herein, the third OP may be configured to indicate whether the DM pin is a test object in the preset test mode, and the fourth OP may be configured to indicate whether the DM pin is enabled.

DETAILED DESCRIPTION

Figure 1:
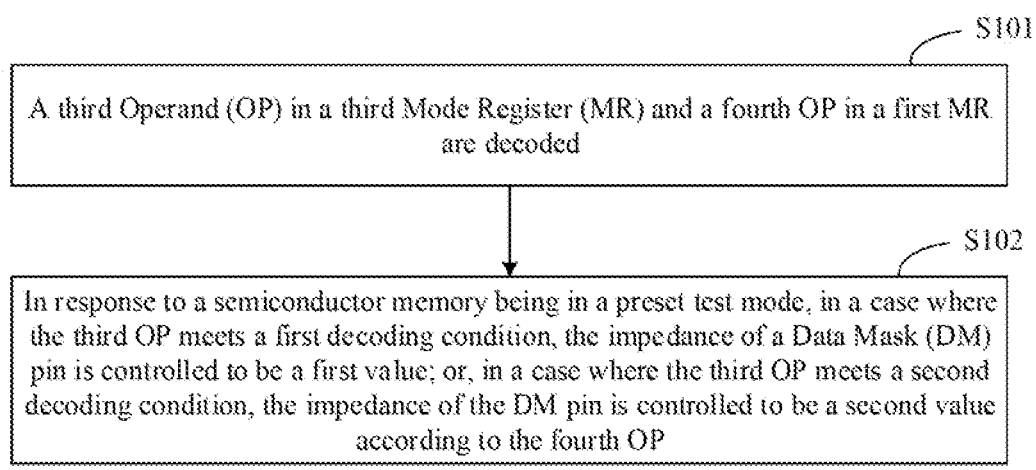
FIG. 1 is a flowchart of a control method according to an embodiment of the present disclosure.

The technical solutions in the embodiments of the present disclosure will be clearly and completely described in conjunction with the drawings in the embodiments of the present disclosure. It should be understood that that the specific embodiments described herein are only used to illustrate the relevant disclosure, but are not intended to limit the disclosure. In addition, it is to be noted that, for the convenience of description, only the parts related to the relevant disclosure are shown in the drawings.

Unless otherwise defined, all technical and scientific terms used herein have the same meaning as commonly understood by those skilled in the art of the present disclosure. The terms used herein are only for the purpose of describing the embodiments of the present disclosure and are not intended to limit the present disclosure.

In the following description, reference is made to "some embodiments" which describe a subset of all possible embodiments, but it should be understood that "some embodiments" may be the same or different subsets of all possible embodiments, and may be combined with each other without conflict.

It is to be noted that the terms "first\second\third" involved in the embodiments of the present disclosure are only used to distinguish similar objects, and do not represent a specific order of the objects. It should be understood that the specific order or sequence of "first\second\third" may be interchangeable under the allowable circumstances, so that the embodiments of the disclosure described herein may be implemented in an order other than those illustrated or described herein.

The following are explanations of professional terms involved in the embodiments of the present disclosure and the corresponding relationship of some nouns:

Dynamic Random Access Memory (DRAM)
Synchronous Dynamic Random Access Memory (SDRAM)
Double Data Rate SDRAM (DDR)
DDR5 Specification (DDR5 SPEC)
Data (DQ) pin
Data Mask (DM) pin
Package Output Driver Test Mode (PODTM)
Mode Register (MR)
Operand (OP)

DDR5 SPEC specifies a new test mode, referred to as the PODTM, which is configured to enable an Output Driver of the DQ pin or the DM pin through a host after a chip is packaged, and make other DQ pins or DM pins be in a termination state at the same time, so as to test whether the pull-up impedance of the enabled DQ pin or the DM pin in an output driver state meets expectation. However, since the output driver state of the DM pin is not defined originally, the PODTM may not be adapted to the DM pin, and circuit processing errors are easily caused.

Based on this, the embodiments of the present disclosure provide a control method. An impedance control strategy for the DM pin in the preset test mode is provided, which may test the impedance of the DM pin in the preset test mode to avoid circuit processing errors.

The embodiments of the present disclosure will be described in detail below with reference to the accompanying drawings.

In an embodiment of the present disclosure, a control method is provided, which may include that: when a semiconductor memory is in a preset test mode, if a DM pin is selected as a test object, the impedance of the DM pin is controlled to be a first impedance parameter through a first MR; or, if the DM pin is not the test object, the impedance of the DM pin is controlled to be a second impedance parameter through a second MR.

It is to be noted that the control method provided in the embodiment of the present disclosure is applied to the semiconductor memory. The semiconductor memory includes the DM pin and at least one DQ pin. Herein, the DQ pin is configured to receive or output data, and has a Write function or a Read function, and has a termination state and an output driver state. The DM pin is configured to receive an input mask signal of write data, and only has the Write function, and has the termination state.

In the embodiment of the present disclosure, the preset test mode is a PODTM introduced in DDR5, and the PODTM is configured to test the impedance of the DM pin or the at least one DQ pin after packaging. More specifically, the PODTM allows a host to test the pull-up impedance of the DM pin or the DQ pin.

When the DM pin is selected as the test object in the PODTM, the first MR is allowed to control the impedance of the DM pin to be the first impedance parameter. Here, since the first MR is configured to indicate the Pull-up impedance of the DQ pin in the output driver state, the host may test the pull-up impedance related to the output drive of the DM pin, and there is no need to define the output driver state of the DM pin.

When the DM pin is not the test object in the PODTM, the second MR is allowed to control the impedance of the DM pin to be the second impedance parameter. Here, since the second MR is configured to indicate the impedance in the termination state, the influence of the DM pin on a test result of the selected test object may be avoided.

In this way, when the semiconductor memory is in the preset test mode, the first MR and the second MR are allowed to directly define the impedance of the DM pin. The DM pin does not need to add definition of the output driver state and a related control circuit for the preset test mode to ensure that the preset test mode is adapted to the DM pin. The impedance of the DM pin may be tested in the preset test mode to avoid the circuit processing errors.

In some embodiments, the method further includes that: when the semiconductor memory is in the preset test mode, if the DQ pin is selected as the test object, the impedance of the DQ pin is controlled to be the first impedance parameter through the first MR; or, if the DQ pin is not the test object, the impedance of the DQ pin is controlled to be the second impedance parameter through the second MR.

In this way, when the DQ pin is selected as the test object in the PODTM, the pull-up output driver impedance of the DQ pin is controlled through the first MR, so as to obtain the test result of the DQ pin. When the DQ pin is not taken as the test object in the PODTM, the DQ pin is controlled to be in the termination state through the second MR, so as to avoid the influence of the DQ pin on the test result of the selected test object.

In some embodiments, it is determined that the semiconductor memory enters the preset test mode and selects the test object through a third MR; or, it is determined that the semiconductor memory does not enter the preset test mode through the third MR.

It should be understood that each MR has a plurality of OPs to provide corresponding control functions. In the embodiment of the present disclosure, the OP related to the embodiment of the present disclosure in the first MR is referred to as a first OP, the OP related to the embodiment of the present disclosure in the second MR is referred to as a second OP, and the OP related to the embodiment of the present disclosure in the third MR is referred to as a third OP.

That is, in the embodiment of the present disclosure, it is determined whether the semiconductor memory enters the PODTM through the third OP in the third MR, and in the case of entering the PODTM, the test object is selected from the DM pin and the at least one DQ pin. Then, the impedance of the selected test object is controlled to be the first impedance parameter (essentially the pull-up output driver impedance) through the first OP in the first MR, and the impedance of an unselected pin is controlled to be the second impedance parameter (essentially the termination impedance) through the second OP in the second MR, so as to obtain the impedance test result of the test object. The DM pin does not need to add definition of the output driver state and the related control circuit for the preset test mode to ensure that the preset test mode is adapted to the DM pin. The impedance of the DM pin may be tested in the preset test mode to avoid the circuit processing errors.

In some embodiments, the standard number of the first MR is 5, and the first OP is an OP from the second bit to the first bit stored in the first MR, represented as MR5 OP[2:1]. The standard number of the second MR is 34, and the second OP is an OP from the second bit to the 0th bit stored in the second MR, represented as MR34 OP[2:0]. The standard number of the third MR is 61, and the third OP is an OP from the 4th bit to the 0th bit stored in the third MR, represented as MR61 OP[4:0]. Here, the standard number is a number of the MR in the DDR5.

The third OP MR61 OP[4:0], the first OP MR5 OP[2:1], and the second OP MR34 OP[2:0] are specifically described below in conjunction with Tables 1 to 3.

As shown in Table 1, MR61 OP[4:0] is configured to determine whether to enter the PODTM, and to determine the selected pin. It should be understood that the numbers of DM pins and the DQ pins are different for the semiconductor memories of different bits. For a 4-bit (X4) memory, there are one low-bit DM pin (represented as DML) and four low-bit DQ pins (respectively referred to as DQL0-DQL3). For an 8-bit (X8) memory, there are one low-bit DM pin (represented as DML) and eight low-bit DQ pins (respectively referred to as DQL0-DQL7). For a 16-bit (X16) memory, there are one low-bit DM pin (represented as DML), one high-bit DM pin (represented as DMU), eight low-bit DQ pins (respectively referred to as DQL0-DQL8) and eight high-bit DQ pins (respectively referred to as DQU0-DQU8).

If MR61 OP[4:0]=$00000_B$, it means that the semiconductor memory is not in the PODTM. If a value of MR61 OP[4:0] is any combination other than $00000_B$ in Table 1, it means that the semiconductor memory is in the PODTM. Specifically, if MR61 OP[4:0]=$00001_B$, it means that the test object is the DML. If MR61 OP[4:0]=$00010_B$, it means that the test object is the DMU (only valid for the 16-bit memory). If MR61 OP[4:0]=$10000_B$, it means that the test object is the 0-bit DQ pin DQL0. Others may be understood by reference, and may not be explained one by one.

TABLE 1

| MR and OP | Function | Parameter description |
|---|---|---|
| MR61 OP[4:0] | Package Output | $00000_B$: Package Test Disabled (Default)<br>$00001_B$: Package Test DML |

TABLE 1-continued

| MR and OP | Function | Parameter description |
|---|---|---|
| | Driver Test Mode | $00010_B$: Package Test DMU (X16 only)<br>$10000_B$: Package Test DQL0<br>$10001_B$: Package Test DQL1<br>$10010_B$: Package Test DQL2<br>$10011_B$: Package Test DQL3<br>$10100_B$: Package Test DQL4 (X8 and X16 Only)<br>$10101_B$: Package Test DQL5 (X8 and X16 Only)<br>$10110_B$: Package Test DQL6 (X8 and X16 Only)<br>$10111_B$: Package Test DQL7 (X8 and X16 Only)<br>$11000_B$: Package Test DQU0 (X16 Only)<br>$11001_B$: Package Test DQU1 (X16 Only)<br>$11010_B$: Package Test DQU2 (X16 Only)<br>$11011_B$: Package Test DQU3 (X16 Only)<br>$11100_B$: Package Test DQU4 (X16 Only)<br>$11101_B$: Package Test DQU5 (X16 Only)<br>$11110_B$: Package Test DQU6 (X16 Only)<br>$11111_B$: Package Test DQU7 (X16 Only) |

As shown in Table 2, MR5 OP[2:1] is configured to determine the Pull-up Output Driver Impedance of the DQ pin, so that the impedance of the selected pin is controlled to be the first impedance parameter through MR5 OP[2:1] in the PODTM.

If MR5 OP[2:1]=$00_B$, it means that the pull-up input driver impedance should be RZQ/7, that is, 34 ohms. If MR5 OP[2:1]=$01_B$, it means that the pull-up input driver impedance should be RZQ/6, that is, 40 ohms. If MR5 OP[2:1]=1 OB, it means that the pull-up input driver impedance should be RZQ/5, that is, 48 ohms. Here, RZQ is a standard resistance value, that is, 240 ohms.

TABLE 2

| MR and OP | Function | Parameter description |
|---|---|---|
| MR5 OP[2:1] | Pull-up Output Driver Impedance | $00_B$: RZQ/7 (34)<br>$01_B$: RZQ/6 (40)<br>$10_B$: RZQ/5 (48) |

As shown in Table 3, MR34 OP[2:0] is configured to determine the termination impedance (RTT_PARK) of the DQ pin or the DM pin, so that the impedance of the unselected pin is controlled to be the second impedance parameter through MR34 OP[2:0] in the PODTM.

If MR5 OP[2:0]=$001_B$, it means that the termination impedance is RZQ, that is, 240 ohms. If MR5 OP[2:0]=$010_B$, it means that the termination impedance is RZQ/2, that is, 120 ohms. Others may be understood by reference, and may not be explained one by one.

TABLE 3

| MR and OP | Function | Parameter description |
|---|---|---|
| MR34 OP[2:0] | RTT_PARK | $000_B$: RTT_OFF default<br>$001_B$: RZQ (240)<br>$010_B$: RZQ/2 (120)<br>$011_B$: RZQ/3 (80)<br>$100_B$: RZQ/4 (60)<br>$101_B$: RZQ/5 (48)<br>$110_B$: RZQ/6 (40)<br>$111_B$: RZQ/7 (34) |

In addition, the unexplained parts in Tables 1 to 3 may be understood with reference to the DDR5 SPEC.

As can be seen from the above, when the DRAM is in the PODTM, the Host is allowed to independently turn on the output driver circuit of the single pin in the DRAM and control other pins to be in the termination state at the same time, so as to perform a characteristic test on the packaged DRAM. In order to enable the PODTM, the host selects the DM pin or the DQ pin as a target test object by setting MR61: OP[4:0], and the host also controls the pull-up impedance value of the output driver circuit of the target test object to be 34 ohms by setting MR5 OP[2:1]=00$_B$. Meanwhile, the impedance state of the remaining DM pins or DQ pins in the DRAM is defined as RTT_PARK by MR34 OP[2:0]. It is to be noted that whether the DM pin is enabled is defined by MR5 OP[5]. In addition, if the DM pin is selected as the target test object in the PODTM, the DRAM may set the impedance of the DM pin according to MR5 OP[2:1].

In some embodiments, in the case of determining that the semiconductor memory enters the preset test mode, the method further includes the following operations.

The first OP stored in the first MR, the second OP stored in the second MR and the third OP stored in the third MR are acquired.

Decoding processing is performed on the third OP to obtain a first test flag signal and at least one second test flag signal. Herein, the first test flag signal indicates whether the DM pin is the test object, and the second test flag signal indicates whether the DQ pin is the test object.

One of the first OP and the second OP is selected according to the first test flag signal to control the impedance of the DM pin.

It is to be noted that the first test flag signal is an internal flag signal introduced for the DM pin to indicate whether the DM pin is the test object in the PODTM. The second test flag signal is an internal flag signal introduced for the DQ pin to indicate whether the DQ pin is the test object in the PODTM. Both the first test flag signal and the second test flag signal are obtained by decoding according to MR61 OP[4:0], which may specifically refer to Table 1.

In order to realize the above mechanism, a specific signal processing method is exemplarily provided below.

In some embodiments, for the DM pin, the method further includes the following operations.

A first non-test state control signal and a second impedance control signal are determined.

When the semiconductor memory is in the preset test mode, a first impedance control signal is determined based on one of the first OP and the second OP according to the first test flag signal. Or, when the semiconductor memory is not in the preset test mode, the first impedance control signal is determined based on the first non-test state control signal.

One of the first impedance control signal and the second impedance control signal is selected according to the working state of the semiconductor memory to control the impedance of the DM pin.

It is to be noted that although the functions of the DM pin and the DQ pin are different, the DM pin and the DQ pin adopt similar signal control principles and circuit structures for the convenience of industrial manufacturing. Specifically, each pin may be regarded as having a read-related attribute and a write-related attribute, and the final impedance of each pin is controlled by an effective signal in a signal corresponding to the read-related attribute and a signal corresponding to the write-related attribute. Therefore, each pin respectively supports a Read function and a Write function under different working scenarios (although the read function of the DM pin is disabled).

In one case, the first non-test state control signal is configured to indicate the impedance of the DM pin in the state other than the preset test state, and the second impedance control signal is configured to indicate the impedance of the DQ pin in the output driver state. Here, the impedance of the DM pin in the state other than the preset test state may include the impedance at normal write and the impedance at non-read and non-write, each belonging to the write-related attribute.

At this time, the first non-test state control signal may be understood as the signal corresponding to the write-related attribute, and the second impedance control signal may be understood as the signal corresponding to the read-related attribute. In this way, in the PODTM, the first impedance control signal corresponding to the PODTM is determined according to one of the first OP or the second OP. Or in the non-PODTM, the first impedance control signal corresponding to the write-related attribute is determined according to the first non-test state control signal. Then, according to the working state of the semiconductor memory, the impedance of the DM pin is controlled using the PODTM or the first impedance control signal corresponding to the write-related attribute or the second impedance control signal corresponding to the read-related attribute. Specifically, the working states of the semiconductor memory may include a write state, a read state, a non-read and non-write state, and a preset test mode (PODTM). Herein, (1) when the semiconductor memory is in the write state or the non-read and non-write state or the preset test mode, the impedance of the DM pin is controlled using the first impedance control signal. (2) When the semiconductor memory is in the read state, the impedance of the DM pin is controlled using the second impedance control signal.

In this way, by merging a signal control strategy of the DM pin in the PODTM into a signal control strategy of the write-related attribute, the impedance control of the PODTM is realized.

In another case, the first non-test state control signal is configured to indicate the impedance of the DQ pin in the output driver state, and the second impedance control signal is configured to indicate the impedance of the DM pin in the state other than the preset test state.

At this time, the first non-test state control signal may be understood as the signal corresponding to the read-related attribute, and the second impedance control signal may be understood as the signal corresponding to the write-related attribute. In this way, in the PODTM, the first impedance control signal corresponding to the PODTM is determined according to one of the first OP or the second OP. Or in the non-PODTM, the first impedance control signal corresponding to the read-related attribute is determined according to the first non-test state control signal. Then, according to the working state of the semiconductor memory, the impedance of the DM pin is controlled using the PODTM or the first impedance control signal corresponding to the read-related attribute or the second impedance control signal corresponding to the write-related attribute. Specifically, the working states of the semiconductor memory may include the write state, the read state, the non-read and non-write state, and the preset test mode (PODTM). Herein, (1) when the semiconductor memory is in the write state or the non-read and non-write state, the impedance of the DM pin is controlled using the second impedance control signal. (2) When the semiconductor memory is in the read state or the preset test mode, the impedance of the DM pin is controlled using the first impedance control signal.

In this way, by merging the signal control strategy of the DM pin in the PODTM into a signal control strategy of the read-related attribute, the impedance control of the PODTM is realized.

Similarly, a specific signal control method for the DQ pin is exemplarily provided below.

In some embodiments, for the DQ pin, the method further includes the following operations.

A third non-test state control signal, a fourth impedance control signal and a fifth impedance control signal are determined.

When the semiconductor memory is in the preset test mode, a third impedance control signal is determined based on one of the first OP and the second OP according to the second test flag signal. Or, when the semiconductor memory is not in the preset test mode, the third impedance control signal is determined based on the third non-test state control signal.

According to the working state of the semiconductor memory, the third impedance control signal and the fifth impedance control signal are selected to control the impedance of the DQ pin, or the fourth impedance control signal and the fifth impedance control signal are selected to control the impedance of the DQ pin.

Therefore, in one case, the third non-test state control signal is configured to indicate the impedance of the corresponding DQ pin in the termination state, and the fourth impedance control signal and the fifth impedance control signal are jointly configured to indicate the impedance of the corresponding DQ pin in the output driver state. Specifically, the working states of the semiconductor memory may include the write state, the read state, the non-read and non-write state, and the preset test mode (PODTM). Herein, (1) when the semiconductor memory is in the write state or the non-read and non-write state or the preset test mode, the impedance of the DQ pin is controlled using the third impedance control signal and the fifth impedance signal. (2) When the semiconductor memory is in the read state, the impedance of the DQ pin is controlled using the fourth impedance control signal and the fifth impedance control signal.

In this way, by merging a signal control strategy of the DQ pin in the PODTM into the signal control strategy of the write-related attribute, the impedance control of the PODTM is realized.

In another case, the third non-test state control signal and the fifth impedance control signal are jointly configured to indicate the impedance of the corresponding DQ pin in the output driver state, and the fourth impedance control signal is configured to indicate the impedance of the corresponding DQ pin in the termination state. Specifically, the working states of the semiconductor memory may include the write state, the read state, the non-read and non-write state, and the preset test mode (PODTM). Herein, (1) when the semiconductor memory is in the write state or the non-read and non-write state, the impedance of the DQ pin is controlled using the fourth impedance control signal and the fifth impedance control signal. (2) When the semiconductor memory is in the read state or the preset test state, the impedance of the DQ pin is controlled using the third impedance control signal and the fifth impedance control signal.

In this way, by merging the signal control strategy of the DQ pin in the PODTM into the signal control strategy of the read-related attribute, the impedance control of the PODTM is realized.

It should be understood that the Write function only involves controlling the pull-up impedance (as the termination impedance), and the Read function involves controlling the pull-up impedance and the pull-down impedance at the same time. Since the DM pin only enables the Write function but not the Read function, the DM pin only involves the control signal of the pull-up impedance, and the control signal of its pull-down impedance will be set to be a fixed level signal to disable the pull-down impedance function. In addition, since the DQ pin supports the Write function and the Read function at the same time, the DQ pin may involve the control signal of the pull-up impedance and the control signal of the pull-down impedance.

Therefore, the read-related attribute of the DM pin only involves one signal (the first non-test state control signal or the second impedance control signal), which is configured to control the pull-up impedance. The read-related attribute of the DQ pin involves two signals (the third non-test state control signal and the fifth impedance control signal, or the fourth impedance control signal and the fifth impedance control signal), which respectively control the pull-up impedance and the pull-down impedance.

Embodiments of the present disclosure provide the control method. When the semiconductor memory is in the preset test mode, the first MR and the second MR related to the DQ pin are allowed to directly define the impedance of the DM pin. The DM pin does not need to add definition of the output driver state and the related control circuit for the preset test mode to ensure that the preset test mode is adapted to the DM pin. The impedance of the DM pin may be tested in the preset test mode to avoid circuit processing errors.

Further, for the aforementioned control method, after entering the preset test mode, the impedance state of the DM pin is determined by an internal flag signal (the first test flag signal). However, the enable control signal configured to indicate whether the DM pin is enabled has been specified in DDR5, that is, the enable control signal may control the impedance state of the DM pin, and the control strategy of the DM pin may be confused to cause the circuit processing errors. It should be understood that since the DQ pin is always in the enabled state in the normal working mode, and does not involve the control of enabling or not, so that there is no similar problem.

Based on this, in another embodiment of the present disclosure, referring to FIG. 1, which shows a flowchart of a control method according to an embodiment of the present disclosure. As shown in FIG. 1, the method may include the following operations.

At S101, a third OP in a third MR and a fourth OP in a first MR are decoded.

At S102, in response to the semiconductor memory being in a preset test mode, in a case where the third OP meets a first decoding condition, the impedance of the DM pin is controlled to be a first value. Or, in a case where the third OP meets a second decoding condition, the impedance of the DM pin is controlled to be a second value according to the fourth OP.

It is to be noted that the control method provided by the embodiment of the present disclosure is applied to the aforementioned semiconductor memory. The semiconductor memory includes the DM pin, and the DM pin is configured to receive an input mask signal of write data. The preset test mode is a PODTM.

It is to be noted that the third OP is configured to indicate whether the DM pin is a test object in the preset test mode, and the fourth OP is configured to indicate whether the DM pin is enabled.

In addition, the first MR is represented as MR5, the fourth OP is represented as MR5 OP[5], the third MR is represented as MR61, and the third OP is represented as MR61 OP [4:0], which may refer to the above description for details.

In this way, since both the third OP and the fourth OP may control the impedance state of the DM pin to avoid the circuit processing errors, the following impedance control strategy is provided: if the third OP meets the first decoding condition, the impedance of the DM pin is directly determined, and if the third OP meets the second decoding condition, the impedance of the DM pin is determined in combination with the fourth OP. In this way, the impedance control strategy for the DM pin in the preset test mode is provided, which may test the impedance of the DM pin in the preset test mode to avoid the circuit processing errors.

In some embodiments, the first value is a first impedance parameter. The first decoding condition indicates that the DM pin is the test object in the preset test mode. The operation that the impedance of the DM pin is controlled to be a first value includes the following operation.

A first OP in the first MR is decoded, and the impedance of the DM pin is controlled to be the first impedance parameter according to a decoding result.

Here, the semiconductor memory further includes at least one DQ pin, the DQ pin is configured to receive or output data, and the first OP is configured to indicate that the impedance of the at least one DQ pin in an output driver state is the first impedance parameter, which may refer to the above description for details.

In some embodiments, the second value includes a second impedance parameter and a high impedance state. The second decoding condition indicates that the DM pin is not the test object in the preset test mode. The operation that the impedance of the DM pin is controlled to be a second value according to the fourth OP includes the following operations.

In a case where the fourth OP meets a third decoding condition, a second OP in a second MR is decoded, and the impedance of the DM pin is controlled to be the second impedance parameter according to the decoding result. The third decoding condition indicates that the DM pin is enabled.

In a case where the fourth OP meets a fourth decoding condition, the impedance of the DM pin is controlled to be in the high impedance state through a first fixed level signal. The fourth decoding condition indicates that the DM pin is disabled.

It is to be noted that the second OP is configured to indicate that the impedance of the at least one DQ pin in a termination state is the second impedance parameter, which may refer to the above description for details.

In this way, after entering the PODTM, when the DM pin is selected as the test object in the PODTM, whether the DM pin is enabled, the first OP is allowed to control the impedance of the DM pin to be the first impedance parameter. Here, since the first OP is configured to indicate the Pull-up impedance of the DQ pin in the output driver state, the host may test the pull-up impedance related to the output drive of the DM pin, and there is no need to define the output driver state of the DM pin. When the DM pin is not the test object in the PODTM and the DM pin is enabled, the second OP is allowed to control the impedance of the DM pin to be the second impedance parameter. Here, since the second OP is configured to indicate the impedance in the termination state, the influence of the DM pin on a test result of the selected test object may be avoided. In addition, when the DM pin is not the test object in the PODTM and the DM pin is disabled, the DM pin is controlled to be in the high impedance state.

Figure 2:
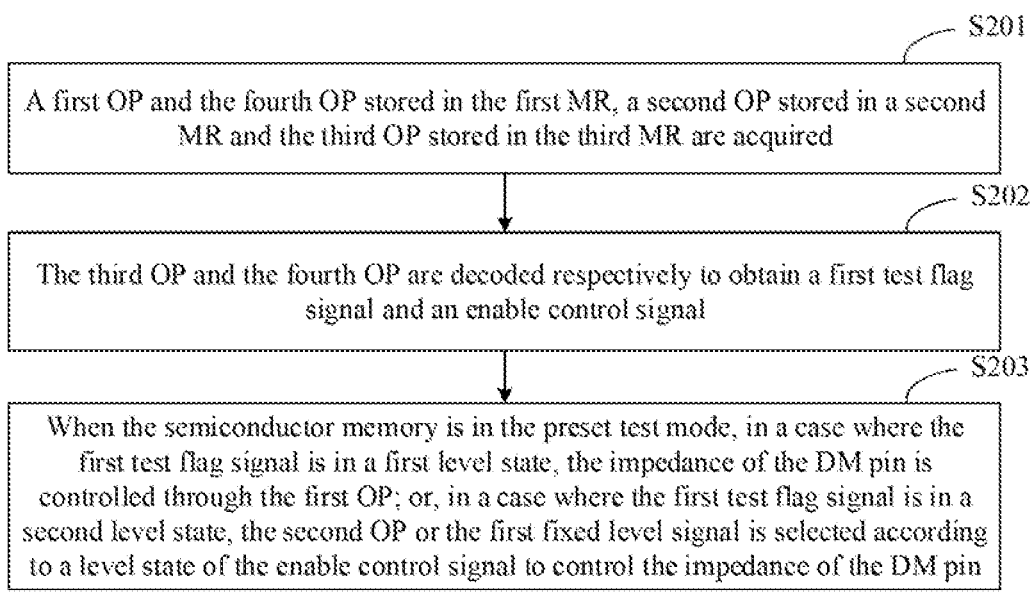
FIG. 2 is a flowchart of another control method according to an embodiment of the present disclosure.

In some embodiments, as shown in FIG. 2, the method further includes the following operations.

At S201, the first OP and the fourth OP stored in the first MR, the second OP stored in the second MR and the third OP stored in the third MR are acquired.

At S202, the third OP and the fourth OP are decoded respectively to obtain a first test flag signal and an enable control signal.

At S203, when the semiconductor memory is in the preset test mode, in a case where the first test flag signal is in a first level state, the impedance of the DM pin is controlled through the first OP, or, in a case where the first test flag signal is in a second level state, the second OP or the first fixed level signal is selected according to a level state of the enable control signal to control the impedance of the DM pin.

Here, when the third OP meets the first decoding condition, the first test flag signal is in the first level state. When the third OP meets the second decoding condition, the first test flag signal is in the second level state. When the fourth OP meets the third decoding condition, the enable control signal is in the first level state. When the fourth OP meets the fourth decoding condition, the enable control signal is in the second level state.

In the following description, the first level state may be logic "1", and the second level state may be logic "0", but this does not constitute a relevant limitation. In the case of adaptive adjustment of circuit logic, the first level state may be logic "0", and the second level state may be logic "1". Meanwhile, the specific value of the first fixed level state also needs to be determined according to circuit logic adaptability.

Combined with Table 4, the signal control strategy in the preset test mode is described in detail. In Table 4, the first test flag signal is represented by PODTM_DM_EN, the enable control signal is represented by DM_enable, the test enable signal PODTM_EN=1 means that the semiconductor memory enters the PODTM.

TABLE 4

| PODTM_EN | DM_enable | PODTM_DM_EN | DM | DQ |
|---|---|---|---|---|
| 1 | 0 | 0 | Hi-Z | Test object: RONpu (MR5 OP[2:1]) Non-test object: RTT_PARK (MR34 OP[2:0]) |
| 1 | 0 | 1 | RONpu (MR5 OP[2:1]) | RTT_PARK (MR34 OP[2:0]) |
| 1 | 1 | 0 | RTT_PARK (MR34 OP[2:0]) | Test object: RONpu (MR5 OP[2:1] ) Non-test object: RTT_PARK (MR34 OP[2:0]) |
| 1 | 1 | 1 | RONpu (MR5 OP[2:1]) | RTT_PARK (MR34 OP[2:0]) |

As shown in Table 4, after entering the PODTM (PODTM_EN=1), the following situations are classified.

(1) For the DM pin, if the first test flag signal PODTM_DM_EN is logic "1", no matter what state the enable control signal DM_enable is in, the DM pin is the test object, and its impedance is the first impedance parameter, which is specifically controlled by the first OP MR5 OP[2:1]. For the DQ pin, all the DQ pins are not the test object, so that the impedances of the all DQ pin are the second impedance parameter RTT PARK, which is specifically controlled by the second OP MR34 OP[2:0].

(2) For the DM pin, if the first test flag signal PODTM_DM_EN is logic "0", and the enable control signal DM_enable is logic "1", it means that the DM pin is not the test object and is enabled, and its impedance is the second impedance parameter RTT_PARK, which is specifically controlled by the second OP MR34 OP[2:0]. For the DQ pin, the impedance of the DQ pin selected as the test object is the first impedance parameter, which is specifically controlled by the first OP MR5 OP[2:1]. The impedance of the DQ pin unselected as the test object is the second impedance parameter, which is specifically controlled by the second OP MR34 OP[2:0].

(3) For the DM pin, if the first test flag signal PODTM_DM_EN is logic "0", and the enable control signal DM_enable is logic "0", it means that the DM pin is the test object and is disabled, and the DM pin is controlled to be in the high impedance state Hi-Z. For the DQ pin, the impedance of the DQ pin selected as the test object is the first impedance parameter, which is specifically controlled by the first OP MR5 OP[2:1]. The impedance of the DQ pin unselected as the test object is the second impedance parameter, which is specifically controlled by the second OP MR34 OP[2:0].

In this way, the embodiments of the present disclosure provide an impedance control strategy for the DM pin in the PODTM mode, which may test the impedance of the DM pin in the PODTM to avoid circuit errors.

In order to realize the above impedance control strategy, a specific signal processing method is exemplarily provided below.

In some embodiments, the method further includes the following operations.

A first non-test state control signal and a second impedance control signal are determined.

When the semiconductor memory is in the preset test mode, a first impedance control signal is output based on one of the first fixed level signal, the first OP and the second OP according to a level state of the first test flag signal and the level state of the enable control signal. Or, when the semiconductor memory is not in the preset test mode, the first impedance control signal is output based on the first non-test state control signal.

One of the first impedance control signal and the second impedance control signal is selected according to the working state of the semiconductor memory to control the impedance of the DM pin.

In one case, the first non-test state control signal is configured to indicate the impedance of the DM pin in the state other than the preset test state, and the second impedance control signal is configured to indicate the impedance of the DQ pin in the output driver state. In this way, by merging a signal control strategy of the DM pin in the PODTM into a signal control strategy of the write-related attribute, the impedance control of the PODTM is realized.

In another case, the first non-test state control signal is configured to indicate the impedance of the DQ pin in the output driver state, and the second impedance control signal is configured to indicate the impedance of the DM pin in the state other than the preset test state. In this way, by merging the signal control strategy of the DM pin in the PODTM into a signal control strategy of the read-related attribute, the impedance control of the PODTM is realized.

The embodiments of the present disclosure provide a control method. Since both the third OP and the fourth OP may affect the DM pin to avoid the circuit processing errors, the following impedance control strategy is provided: if the third OP meets the first decoding condition, the impedance of the DM pin is directly determined, and if the third OP meets the second decoding condition, the impedance of the DM pin is determined in combination with the fourth OP. In this way, the impedance control strategy for the DM pin in the preset test mode is provided, which may test the impedance of the DM pin in the preset test mode to avoid the circuit processing errors.

Figure 3:
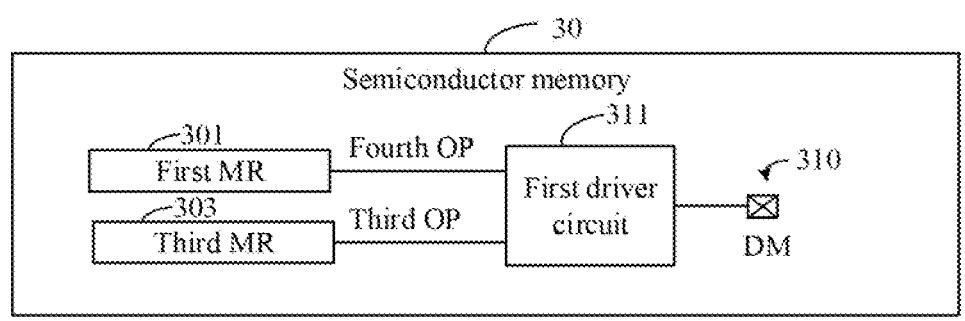
FIG. 3 is a schematic structural diagram of a semiconductor memory according to an embodiment of the present disclosure.

In another embodiment of the present disclosure, referring to FIG. 3, which shows a schematic structural diagram of a semiconductor memory 30 according to an embodiment of the present disclosure. As shown in FIG. 3, the semiconductor memory 30 includes a first MR 301, a third MR 303, a DM pin 310 and a first driver circuit 311, and the first driver circuit 311 is connected with the first MR 301, the third MR 303 and the DM pin respectively.

The DM pin 310 is configured to receive an input mask signal of write data.

The first driver circuit 311 is configured to decode a third OP in a third MR 303 and a fourth OP in a first MR 301; and control, in a case where the third OP meets a first decoding condition, the impedance of the DM pin 310 to be a first value in response to the semiconductor memory being in a preset test mode; or control, in a case where the third OP meets a second decoding condition, the impedance of the DM pin 310 to be a second value according to the fourth OP It is to be noted that the fourth OP is configured to indicate whether the DM pin is enabled, and the third OP is configured to indicate whether the DM pin is a test object in the preset test mode. The preset test mode may be a PODTM, which allows a host to test the pull-up impedance of the DM pin or the DQ pin.

In this way, the impedance control strategy for the DM pin in the preset test mode is provided, which may test the impedance of the DM pin in the preset test mode to avoid the circuit processing errors.

In some embodiments, the first decoding condition indicates that the DM pin 310 is the test object in the preset test mode, and the first value is a first impedance parameter.

The first driver circuit 311 is further configured to decode a first OP in the first MR 301 in a case where the third OP meets a first decoding condition, and control the impedance of the DM pin 310 to be the first impedance parameter according to a decoding result.

Figure 4:
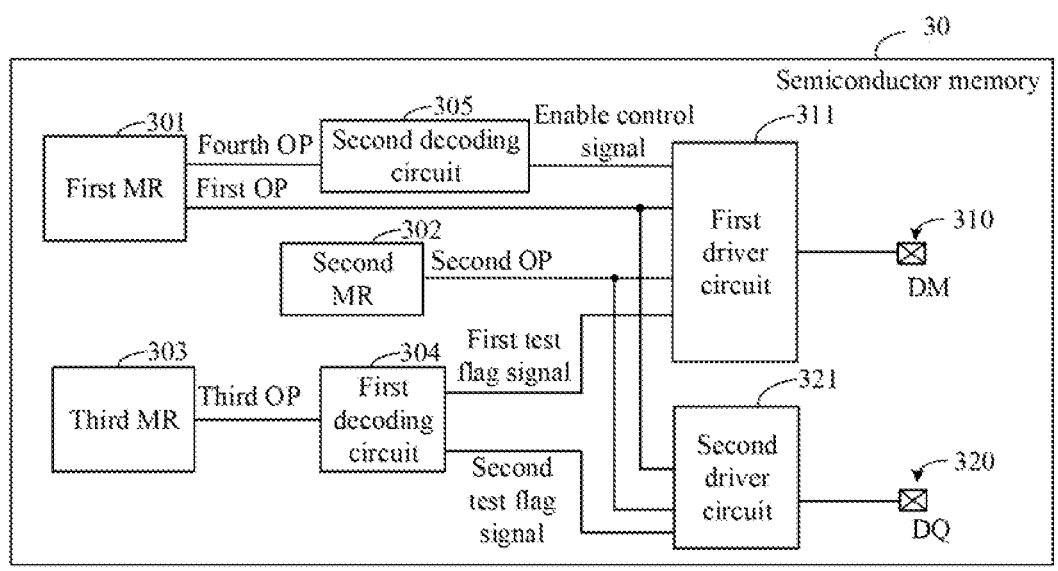
FIG. 4 is a schematic structural diagram of another semiconductor memory according to an embodiment of the present disclosure.

Here, as shown in FIG. 4, the semiconductor memory 30 further includes at least one DQ pin 320. The DQ pin 320 is configured to receive or output data. The first OP is configured to indicate that the impedance of the at least one DQ pin 320 in an output driver state is the first impedance parameter.

In some embodiments, the second decoding condition indicates that the DM pin 310 is not the test object in the preset test mode, and the second value includes a high impedance state and a second impedance parameter. As shown in FIG. 4, The semiconductor memory 30 further includes a second MR 302. The second MR 302 is connected to the first driver circuit 311.

The first driver circuit 311 is further configured to decode a second OP in the second MR 302 in a case where the third OP meets the second decoding condition and the fourth OP meets a third decoding condition, and control the impedance of the DM pin 310 to be the second impedance parameter according to the decoding result; or, control, in a case where the third OP meets the second decoding condition and the fourth OP meets a fourth decoding condition, the DM pin 310 to be in the high impedance state through a first fixed level signal.

Here, the third decoding condition indicates that the DM pin 310 is enabled, and the fourth decoding condition indicates that the DM pin 310 is disabled. The second OP is configured to indicate that the impedance of the at least one DQ pin 320 in a termination state is the second impedance parameter.

It should be understood that only one DQ pin 320 is shown in FIG. 4 for illustration, and there are actually more DQ pins in the semiconductor memory 30. The embodiments of the present disclosure do not limit the numbers of the DM pins 310 and the DQ pins 320.

In this way, the embodiments of the present disclosure provide the impedance control strategies of the DM pin and the DQ pin in the PODTM, which may test the impedance of the DM pin in the PODTM to avoid the circuit errors.

In some embodiments, as shown in FIG. 4, the semiconductor memory 30 further includes a first decoding circuit 304 and a second decoding circuit 305.

The first MR 301 is configured to store and output the first OP and the fourth OP.

The second MR 302 is configured to store and output the second OP.

The third MR 303 is configured to store and output the third OP.

The first decoding circuit 304 is configured to receive the third OP, decode the third OP and output a first test flag signal.

The second decoding circuit 305 is configured to receive the fourth OP, decode the fourth OP and output an enable control signal.

The first driver circuit 311 is configured to receive the first test flag signal, the enable control signal, the first fixed level signal, the first OP and the second OP; and when the semiconductor memory 30 is in the preset test mode, control, in a case where the first test flag signal is in a first level state, the impedance of the DM pin 310 through the first OP, or select, in a case where the first test flag signal is in a second level state, the second OP or the first fixed level signal according to a level state of the enable control signal to control the impedance of the DM pin 310.

It is to be noted that when the third OP meets the first decoding condition, the first test flag signal is in the first level state. When the third OP meets the second decoding condition, the first test flag signal is in the second level state. When the fourth OP meets the third decoding condition, the enable control signal is in the first level state. When the fourth OP meets the fourth decoding condition, the enable control signal is in the second level state.

In some embodiments, as shown in FIG. 4, the semiconductor memory 30 further includes at least one second driver circuit 321, and each second driver circuit 321 is connected with the first MR 301, the second MR 302 and one DQ pin 320.

The second driver circuit 321 is configured to control, if the corresponding DQ pin 320 is selected as the test object, the impedance of the corresponding DM pin 320 to be the first impedance parameter through the first OP in the first MR 301 when the semiconductor memory 30 is in the preset test mode; or, control, if the corresponding DQ pin 320 is not the test object, the impedance of the corresponding DQ pin 320 to be the second impedance parameter through the second OP in the second MR 302.

In some embodiments, the third OP in the third MR 303 is also configured to indicate whether the DQ pin is the test object in the preset test mode. As shown in FIG. 4, the second driver circuit 321 is also connected with the first decoding circuit 304.

The first decoding circuit 304 is further configured to perform decoding processing on the third OP and output at least one second test flag signal. Herein, one second test flag signal is configured to indicate whether one DQ pin is the test object.

The second driver circuit 321 is further configured to receive the corresponding second test flag signal, the first OP and the second OP; and select, in a case where the semiconductor memory 30 enters the preset test mode, one of the first OP and the second OP according to the second test flag signal to control the impedance of the DQ pin 320.

It is to be noted that the first test flag signal is an internal flag signal introduced for the DM pin 310 to indicate whether the DM pin 310 is the test object in the PODTM. The second test flag signal is an internal flag signal introduced for the DQ pin 320 to indicate whether the DQ pin 320 is the test object in the PODTM. Both the first test flag signal and the second test flag signal are obtained by decoding according to the third OP.

As can be seen from the above, after entering the PODTM, when the DM pin is selected as the test object in the PODTM, whether the DM pin is enabled, the first OP is allowed to control the impedance of the DM pin to be the first impedance parameter. Here, since the first OP is configured to indicate the Pull-up impedance of the DQ pin in the output driver state, the host may test the pull-up impedance related to the output drive of the DM pin, and there is no need to define the output driver state of the DM pin. When the DM pin is not the test object in the PODTM and the DM pin is enabled, the second OP is allowed to control the impedance of the DM pin to be the second impedance parameter. Here, since the second OP is configured to indicate the impedance in the termination state, the influence of the DM pin on a test result of the selected test object may be avoided. In addition, when the DM pin is not the test object in the PODTM and the DM pin is disabled, the DM pin is controlled to be in the high impedance state.

It is to be noted that the standard number of the first MR is 5, and the first OP is an OP from the second bit to the first bit stored in the first MR, represented as MR5 OP[2:1]. The fourth OP is the 5th-bit OP stored in the first MR, and is represented as MR5 OP[5]. The standard number of the second MR is 34, and the second OP is an OP from the second bit to the 0th bit stored in the second MR, represented as MR34 OP[2:0]. The standard number of the third MR is 61, and the third OP is an OP from the 4th bit to the 0th bit stored in the third MR, represented as MR61 OP[4:0].

Figure 5:
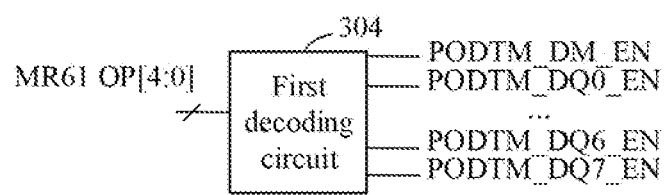
FIG. 5 is a schematic structural diagram of a first decoding circuit according to an embodiment of the present disclosure.

As shown in FIG. 5, taking a 8-bit (X8) semiconductor memory 30 as an example, the first decoding circuit 304 is configured to receive the third OP MR61 OP[4:0], and decode to obtain the first test flag signal PODTM_DM_EN, the second test flag signals PODTM_DQ0_EN-PODTM_DQ7_EN. Here, the second test flag signals PODTM_DQ0_EN-PODTM_DQ7_EN are respectively configured to indicate whether the DQ pins DQL0-DQL7 are the test objects in the PODTM. A logic circuit in the first decoding circuit 304 is designed according to the aforementioned Table 1.

The specific structure description of the first driver circuit 311 is exemplarily provided below.

In the embodiment of the present disclosure, the semiconductor memory 30 is further configured to determine a first non-test state control signal, a second impedance control signal and a first calibration signal ZQ1_CODE[N−1:0]. The first calibration signal ZQ1_CODE[N−1:0] is configured to calibrate a pull-up resistance value.

Figure 6:
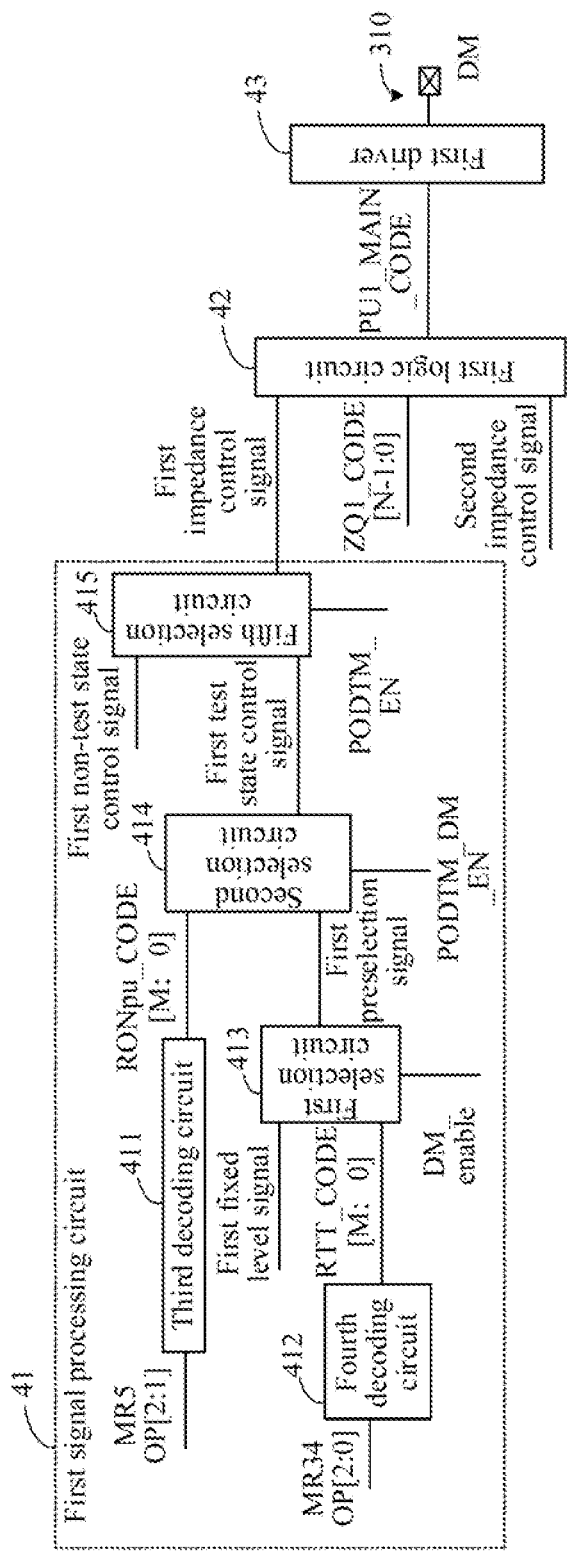
FIG. 6 is a schematic structural diagram of a first driver circuit according to an embodiment of the present disclosure.

As shown in FIG. 6, the first driver circuit 311 may include a first signal processing circuit 41, a first logic circuit 42, and a first driver 43.

The first signal processing circuit 41 is configured to receive the first test flag signal PODTM_DM_EN, the enable control signal DM_enable, the first fixed level signal, the first OP MR5 OP[2:1], the second OP MR34 OP[2:0] and the first non-test state control signal; and output, based on one of the first fixed level signal, the first OP MR5 OP[2:1] and the second OP MR34 OP[2:0], a first impedance control signal according to a level state of the first test flag signal PODTM_DM_EN and the level state of the enable control signal DM_enable when the semiconductor memory 30 is in the preset test state; or, output, based on the first non-test state control signal, the first impedance control signal when the semiconductor memory 30 is not in the preset test mode.

The first logic circuit 42 is configured to receive the first impedance control signal, the second impedance control signal and the first calibration signal ZQ1_CODE[N−1:0]; and select and logically combine the first impedance control signal, the second impedance control signal and the first calibration signal ZQ1_CODE[N−1:0] to output a first target signal PU1_MAIN_CODE.

The first driver 43 includes a plurality of first impedance circuits and configured to receive the first target signal PU1_MAIN_CODE, and control the plurality of first impedance circuits using the first target signal PU1_MAIN_CODE, so as to control the impedance of the DM pin 310.

It should be understood that the DM pin 310 only supports the Write function, and does not need to output data to the outside. In the termination state, it only involves the level pull-up function but not the level pull-down function, so that the first driver circuit 311 only has the first impedance control signal and the second impedance control signal which are configured to control the level pull-up function, and does not involve related signals configured to control the level pull-down function. In addition, the pull-up resistance value of each first impedance circuit may be a standard resistance value. However, with changes in environmental parameters such as temperature and voltage in the actual working environment, the resistance value of the first impedance circuit may also change accordingly. Therefore, the first calibration signal ZQ1_CODE[N−1:0] is configured to calibrate the resistance value of each first impedance circuit to the standard resistance value. Here, all the first impedance circuits share the first calibration signal ZQ1_CODE[N−1:0].

It is to be noted that the first impedance control signal and the second impedance control signal respectively correspond to two attributes, that is, a write-related attribute and a read-related attribute. It should be understood that in the non-PODTM, according to the actual working state, one of the first impedance control signal and the second impedance control signal is valid, which is combined with the first calibration signal ZQ1_CODE[N−1:0] to obtain the first target signal PU1_MAIN_CODE. On the contrary, in the PODTM, the second impedance control signal is fixedly invalid, and the first impedance control signal and the first calibration signal ZQ1_CODE[N−1:0] are combined to obtain the first target signal PU1_MAIN_CODE. Here, the valid signal in the first impedance control signal and the second impedance control signal is configured to enable or disable the level pull-up function of the first impedance circuit, and the first calibration signal ZQ1_CODE[N−1:0] is configured to calibrate the pull-up resistance value of the first impedance circuit to the standard resistance value when the level pull-up function of the first impedance circuit is enabled.

In some embodiments, as shown in FIG. 6, the first signal processing circuit 41 includes a third decoding circuit 411, a fourth decoding circuit 412, a first selection circuit 413, a second selection circuit 414 and a third selection circuit 415.

The third decoding circuit 411 is configured to receive the first OP MR5 OP[2:1], decode the first OP and output a first decoded signal RONpu_CODE[M:0].

The fourth decoding circuit 412 is configured to receive the second OP MR34 OP[2:0], decode the second OP and output a second decoded signal RTT_CODE[M:0].

The first selection circuit 413 is configured to receive the enable control signal DM_enable, the second decoded signal RTT_CODE[M:0] and the first fixed level signal; and select one of the second decoded signal RTT_CODE[M:0] and the first fixed level signal according to a level state of the enable control signal DM_enable to output a first preselection signal.

The second selection circuit 414 is configured to receive the first test flag signal PODTM_DM_EN, the first preselection signal and the first decoded signal RONpu_CODE[M:0]; and select one of the first preselection signal and the first decoded signal RONpu_CODE[M:0] according to a level state of the first test flag signal PODTM_DM_EN to output the first test state control signal.

The third selection circuit 415 is configured to receive the test enable signal PODTM_EN, the first test state control signal and the first non-test state control signal; and select one of the first test state control signal and the first non-test state control signal according to a level state of the test enable signal PODTM_EN to output the first impedance control signal.

It should be understood that a logic circuit in the second decoding circuit 411 is designed according to the aforementioned Table 2, that is, the first decoded signal is configured to represent a resistance value (the first impedance parameter) of the driver impedance Ron, and a logic circuit in the fourth decoding circuit 412 is designed according to the aforementioned Table 3, that is, the second decoded signal is configured to represent a resistance value (the second impedance parameter) of the termination impedance RTT. In addition, M is a positive integer, and its specific value needs to be determined according to the actual working scenario.

It is to be noted that the test enable signal PODTM_EN is configured to indicate whether the semiconductor memory is in the preset test mode PODTM, and is also decoded according to a third control code MR61 OP[4:0]. As shown in Table 1 above, when the value of MR61 OP[4:0] is in other combination forms other than $00000_B$ in Table 1, it indicates that the semiconductor memory is in the preset test mode PODTM, and the test enable signal PODTM_EN is in a first level state (for example, logic "1"). When MR61 OP[4:0]=$00000_B$, it indicates that the semiconductor memory is not in the preset test mode PODTM, and the test enable signal PODTM_EN is in a second level state (for example, logic "0"). Or, it may also be understood that if one of the first test flag signal or the second test flag signal is in the first level state, the test enable signal PODTM_EN is in the first level state. If the first test flag signal and the second test flag signal are in the second level state, the test enable signal PODTM_EN is in the second level state.

For the first driver circuit 311 shown in FIG. 6, according to the different definitions of the first non-test state control signal and the second impedance control signal, there may be two specific implementation modes.

In one implementation mode, the first non-test state control signal is configured to indicate the impedance of the DM pin in a state in the state other than the preset test state, and the second impedance control signal is configured to indicate the impedance of the DQ pin in the output driver state. That is, by merging the signal control strategy of the DM pin in the PODTM into the signal control strategy of the write-related attribute, the impedance control of the PODTM is realized.

Figure 7:
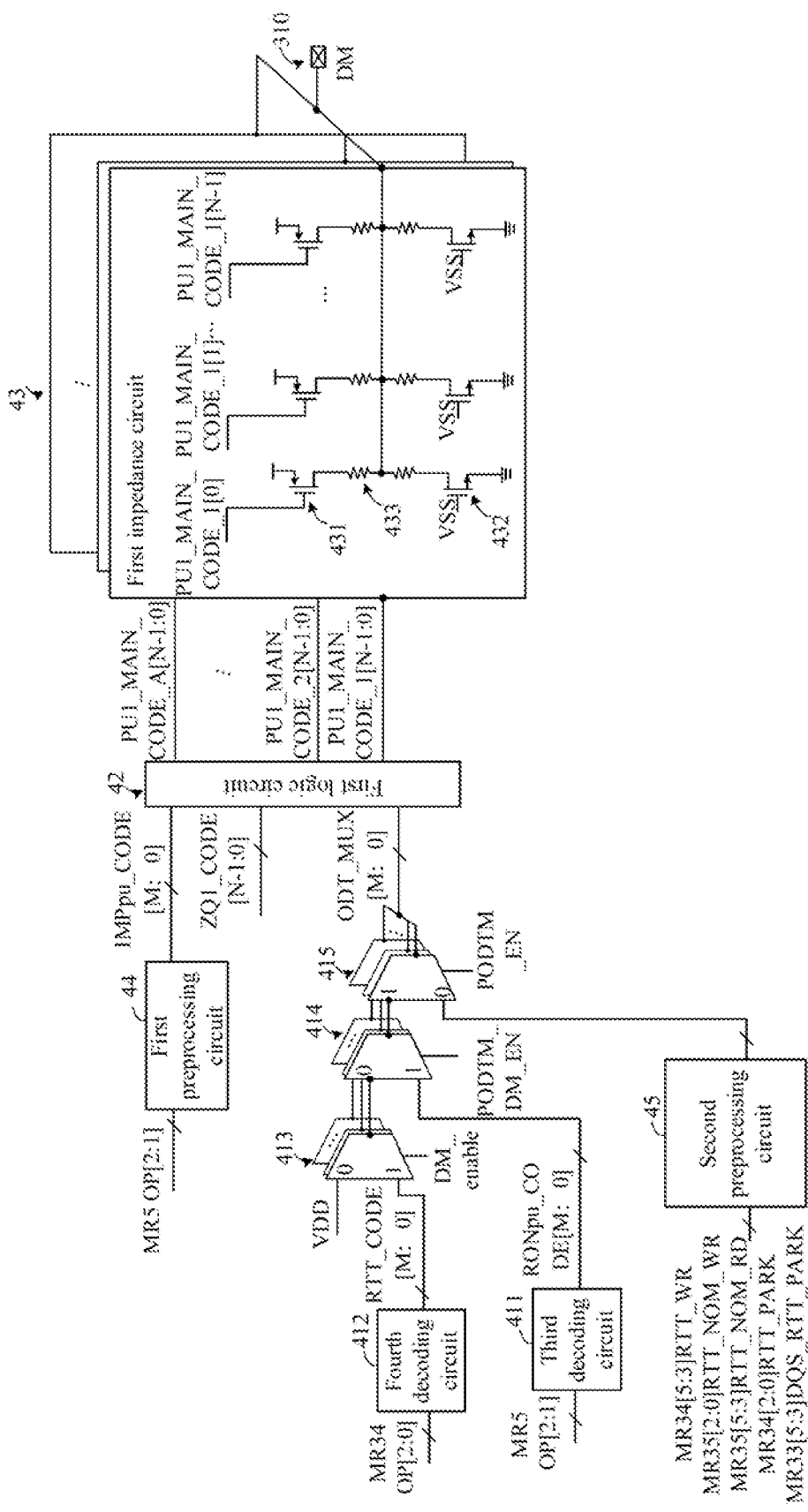
FIG. 7 is a detailed schematic structural diagram I of a first driver circuit according to an embodiment of the present disclosure.

Correspondingly, as shown in FIG. 7, the first impedance control signal is represented by ODT_MUX[M:0], and the second impedance control signal is represented by IMPpu_CODE[M:0]. Particularly, compared with FIG. 6, the first driver circuit 311 in FIG. 7 further includes a first preprocessing circuit 44 and a second preprocessing circuit 45. The first preprocessing circuit 44 is configured to decode the first OP MR5 OP[2:1] to obtain the second impedance control signal IMPpu_CODE[M:0]. The second preprocessing circuit 45 is configured to determine the first non-test state control signal according to MR34[5:3] involving RTT_WR, MR35[2:0] involving RTT_NOM_WR, MR35 [5:3] involving RTT_NOM_RD, MR34[2:0] involving RTT_PARK, and MR33[5:3] involving DQS_RTT_PARK. The specific meanings of the above signals refer to the regulations of DDR5 SPEC, and the signals of the part do not affect the implementation of the non-disclosed embodiments, which will not be described in detail. In addition, in the following description, if the semiconductor memory 30 is in the PODTM, the test enable signal PODTM_EN is logic "1". If the semiconductor memory 30 is not in the PODTM, the test enable signal PODTM_EN is logic "0". If the DM pin 310 is the test object of the PODTM, the first test flag signal PODTM_DM_EN is logic "1". If the DM pin 310 is not the test object of the PODTM, the first test flag signal PODTM_DM_EN is logic "0". If the DM pin 310 is enabled, the enable control signal DM_enable is logic "1". If the DM pin 310 is disabled, the enable control signal DM_enable is logic "0". The first fixed level signal is represented by VDD, and the first fixed level signal VDD indicates that the level pull-up functions of all the first impedance circuits are disabled. It should be understood that the specific value of the first fixed level signal depends on the logic principle of the circuit, and may be adjusted according to the corresponding circuit logic.

The working principle of FIG. 7 is explained below in four working scenarios.

The working scenario 1 is that: the semiconductor memory 30 enters the PODTM and the DM pin 310 is the test object. At this time, since the first test flag signal PODTM_DM_EN is logic "1", the second selection circuit 414 outputs the first decoded signal RONpu_CODE[M:0] to obtain the first test state control signal. Since the test enable signal PODTM_EN is logic "1", the third selection circuit 415 outputs the first test state control signal to obtain the first impedance control signal ODT_MUX[M:0]. As previously described, the second impedance control signal IMPpu_CODE[M:0] in the PODTM is fixedly invalid, so that the first logic circuit 42 actually logically combines the first impedance control signal ODT_MUX[M:0] and the first calibration signal ZQ1_CODE[N−1:0] to obtain the first target signal PU1_MAIN_CODE, thereby controlling the impedance of the DM pin 310 to be the first impedance parameter. Here, the invalidation of the second impedance control signal IMPpu_CODE[M:0] may be achieved in at least two ways of adding corresponding signal blocking logic in the first preprocessing circuit 44, or adding corresponding signal blocking logic in the first logic circuit 42.

As can be seen from the above, for the working scenario 1, the impedance of the DM pin 310 is actually controlled by the first OP MR5 OP[2:1].

The working scenario 2 is that: the semiconductor memory 30 enters the PODTM and the DM pin 310 is not the test object. The enable control signal DM_enable indicates that the DM pin 310 is enabled. At this time, since the enable control signal DM_enable is logic "0", the first selection circuit 413 outputs the second decoded signal RTT_CODE[M:0] to obtain the first preselection signal. Since the first test mart signal PODTM_DM_EN is logic "0", the second selection circuit 414 outputs the first preselection signal to obtain the first test state control signal. Since the test enable signal PODTM_EN is logic "1", the third selection circuit 415 outputs the first test state control signal to obtain the first impedance control signal ODT_MUX[M:0]. As previously described, the second impedance control signal IMPpu_CODE[M:0] in the PODTM is fixedly invalid, so that the first logic circuit 42 actually logically combines the first impedance control signal ODT_MUX[M:0] and the first calibration signal ZQ1_CODE[N−1:0] to obtain the first target signal PU1_MAIN_CODE, thereby controlling the impedance of the DM pin 310 to be the second impedance parameter.

As can be seen from the above, for the working scenario 2, the impedance of the DM pin 310 is actually controlled by the second OP MR34 OP[2:0], and is the second impedance parameter specifically.

The working scenario 3 is that: the semiconductor memory 30 enters the PODTM and the DM pin 310 is not the test object. The enable control signal DM_enable indicates that the DM pin 310 is disabled. At this time, since the enable control signal DM_enable is logic "0", the first selection circuit 413 outputs the first fixed level signal VDD to obtain the first preselection signal, and the second selection circuit 414 outputs the first preselection signal to obtain the first test state control signal. Since the test enable signal PODTM_EN is logic "1", the third selection circuit 415 outputs the first test state control signal to obtain the first impedance control signal ODT_MUX[M:0]. As previously described, the second impedance control signal IMPpu_CODE[M:0] in the PODTM is fixedly invalid, so that the first logic circuit 42 actually logically combines the first impedance control signal ODT_MUX[M:0] and the first calibration signal ZQ1_CODE[N−1:0] to obtain the first target signal PU1_MAIN_CODE. Since the first fixed level signal VDD fixedly indicates that the level pull-up functions of all the first impedance circuits are disabled, the first target signal PU1_MAIN_CODE may control the first driver 43 to be in a disconnected state, so that the DM pin 310 is in the high impedance state Hi-Z.

As can be seen from the above, for the working scenario 3, the impedance of the DM pin 310 is actually controlled by the first fixed level signal VDD, and is the high impedance state Hi-Z specifically.

The working scenario 4 is that: the semiconductor memory 30 does not enter the PODTM. At this time, since the enable control signal PODTM_EN is logic "0", the third selection circuit 415 outputs the first non-test state control signal determined by the second preprocessing circuit 45 to obtain the first impedance control signal ODT_MUX[M:0]. Since the DM pin 310 only supports the Write function, the second impedance control signal IMPpu_CODE[M:0] in the non-PODTM is invalid and the first impedance control signal ODT_MUX[M:0] is valid, so that the first logic circuit 42 combines the first impedance control signal ODT_MUX[M:0] and the first calibration signal ZQ1_CODE[N−1:0] to obtain the first target signal PU1_MAIN_CODE, thereby controlling the impedance of the DM pin 310.

As can be seen from the above, for the working scenario 4, the impedance of the DM pin 310 is actually controlled by the second preprocessing circuit 45.

In another implementation mode, the first non-test state control signal is configured to indicate the impedance of the DQ pin in the output driver state, and the second impedance control signal is configured to indicate the impedance of the DR in the state other than the preset test state. That is, by merging the signal control strategy of the DR in the PODTM into the signal control strategy of the read-related attribute, the impedance control of the PODTM is realized.

Figure 8:
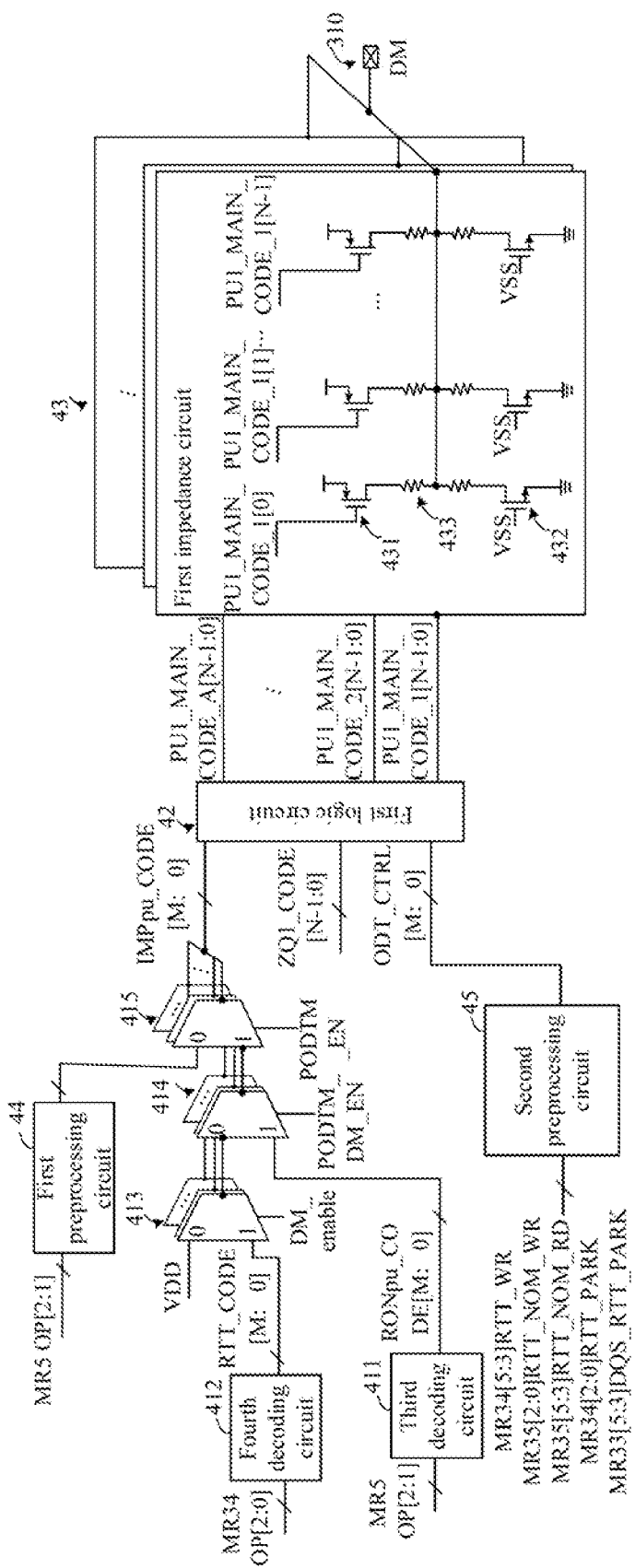
FIG. 8 is a detailed schematic structural diagram II of a first driver circuit according to an embodiment of the present disclosure.

Correspondingly, as shown in FIG. 8, the first impedance control signal is represented by IMPpu_CODE[M:0], and the second impedance control signal is represented by ODT_CTRL[M:0]. Particularly, compared with FIG. 6, the semiconductor memory 30 in FIG. 8 also includes the first preprocessing circuit 44 and the second preprocessing circuit 45.

Similarly, the working principle of FIG. 8 is explained below in four working scenarios.

The working scenario 1 is that: the semiconductor memory 30 enters the PODTM and the DM pin 310 is the test object. At this time, since the first test flag signal PODTM_DM_EN is logic "1", the second selection circuit 414 outputs the first decoded signal RONpu_CODE[M:0] to obtain the first test state control signal. Since the test enable signal PODTM_EN is logic "1", the third selection circuit 415 outputs the first test state control signal to obtain the first impedance control signal IMPpu_CODE[M:0]. As previously described, the second impedance control signal ODT_CTRL[M:0] in the PODTM is fixedly invalid, so that the first logic circuit 42 actually logically combines the first impedance control signal IMPpu_CODE[M:0] and the first calibration signal ZQ1_CODE[N−1:0] to obtain the first target signal PU1_MAIN_CODE, thereby controlling the impedance of the DM pin 310 to be the first impedance parameter.

In this way, for the working scenario 1, the impedance of the DM pin 310 is still controlled by the first OP MR5 OP[2:1], and is the first impedance parameter.

The working scenario 2 is that: the semiconductor memory 30 enters the PODTM and the DM pin 310 is not the test object. The enable control signal DM_enable indicates that the DM pin 310 is enabled. At this time, since the enable control signal DM_enable is logic "1", the first selection circuit 413 outputs the second decoded signal RTT_CODE[M:0] to obtain the first preselection signal. Since the first test flag signal PODTM_DM_EN is logic "0", the second selection circuit 414 outputs the first preselection signal to obtain the first test state control signal. Since the test enable signal PODTM_EN is logic "1", the third selection circuit 415 outputs the first test state control signal to obtain the first impedance control signal IMPpu_CODE[M:0]. As previously described, the second impedance control signal ODT_CTRL in the PODTM is fixedly invalid, so that the first logic circuit 42 actually logically combines the first impedance control signal IMPpu_CODE[M:0] and the first calibration signal ZQ1_CODE[N−1:0] to obtain the first target signal PU1_MAIN_CODE, thereby controlling the impedance of the DM pin 310 to be the second impedance parameter.

As can be seen from the above, for the working scenario 2, the impedance of the DM pin 310 is actually controlled by the second OP MR34 OP[2:0], and is the second impedance parameter specifically.

The working scenario 3 is that: the semiconductor memory 30 enters the PODTM and the DM pin 310 is not the tested object. The enable control signal DM_enable indicates that the DM pin 310 is disabled. At this time, since the enable control signal DM_enable is logic "0", the first selection circuit 413 outputs the first fixed level signal VDD to obtain the first preselection signal, and the second selection circuit 414 outputs the first preselection signal to obtain the first test state control signal. Since the test enable signal PODTM_EN is logic "1", the third selection circuit 415 outputs the first test state control signal to obtain the first impedance control signal IMPpu_CODE[M:0]. As previously described, the second impedance control signal ODT_CTRL in the PODTM is fixedly invalid, so that the first logic circuit 42 actually logically combines the first impedance control signal IMPpu_CODE[M:0] and the first calibration signal ZQ1_CODE[N−1:0] to obtain the first target signal PU1_MAIN_CODE. Since the first fixed level signal VDD fixedly indicates that the level pull-up functions of all the first impedance circuits are disabled, the first target signal PU1_MAIN_CODE may control the first driver 43 to be in a disconnected state, so that the DM pin 310 is in the high impedance state Hi-Z.

As can be seen from the above, for the working scenario 3, the impedance of the DM pin 310 is actually controlled by the first fixed level signal VDD, and is the high impedance state Hi-Z specifically.

The working scenario 4 is that: the semiconductor memory 30 does not enter the PODTM. At this time, since the enable control signal PODTM_EM is logic "0", the third selection circuit 415 outputs the first non-test state control signal determined by the first preprocessing circuit 44 to obtain the first impedance control signal IMPpu_CODE[M:0]. Meanwhile, the second preprocessing circuit 45 outputs the second impedance control signal ODT_CTRL[M:0]. As previously described, since the DM pin 310 only supports the Write function, the first impedance control signal IMPpu_CODE[M:0] in the non-PODTM is invalid and the second impedance control signal ODT_CTRL[M:0] is valid, so that the first logic circuit 42 combines the second impedance control signal ODT_CTRL[M:0] and the first calibration signal ZQ1_CODE[N−1:0] to obtain the first target signal PU1_MAIN_CODE, thereby controlling the impedance of the DM pin 310.

As can be seen from the above, for the working scenario 4, the impedance of the DM pin 310 is actually controlled by the second preprocessing circuit 45, and specifically depends on the actual requirements.

It is also to be noted that in FIG. 7 and FIG. 8, the "I" symbol marked on a signal path is configured to indicate that there are a plurality of signal paths actually, and only one is drawn for illustration. In other words, each signal in MR34 OP[2:0], MR5 OP[2:1], RONpu_CODE[M:0], RTT_CODE[M:0], IMPpu_CODE[M:0], ZQ1_CODE[N−1:0], ODT_CTRL[M:0], ODT_MUX[M:0], and PU1_MAIN_CODE includes a plurality of sub-signals, and each sub-signal has its own signal path.

The signal processing process in the first driver circuit 311 will be described below with reference to FIG. 7 or FIG. 8.

In some embodiments, as shown in FIG. 7 or FIG. 8, each of the first decoded signal RONpu_CODE[M:0], the second decoded signal RTT_CODE[M:0], the first preselection signal, the first fixed level signal, the first test state control signal, the first non-test state control signal and the first impedance control signal includes –M+1 bits of sub-signals, represented as [M:0]. The first selection circuit 413 includes M+1 first data selectors, the second selection circuit 414 includes M+1 second data selectors, and the third selection circuit 415 includes M+1 third data selectors. Herein, an input terminal of one of the first data selectors respectively receives one bit of sub-signal of the second decoded signal RTT_CODE[M:0] and one bit of sub-signal of the first fixed level signal, an output terminal of the one of the first data selectors is configured to output one bit of sub-signal of the first preselection signal, and control terminals of all the first data selectors receive the test enable signal DM_enable. An input terminal of one of the second data selectors receives the one bit of sub-signal of the first preselection signal and one bit of sub-signal of the first decoded signal RONpu_CODE[M:0], an output terminal of the one of the second data selectors is configured to output one bit of sub-signal of the first test state control signal, and control terminals of all the second data selectors receive the first test flag signal PODTM_DM_EN. An input terminal of one of the third data selectors receives the one bit of sub-signal of the first test state control signal and one bit of sub-signal of the first non-test state control signal, an output terminal of the one of the third data selectors is configured to output one bit of sub-signal of the first impedance control signal, and control terminals of all the third data selectors receive the test enable signal PODTM_EN. Herein, M is a positive integer.

It is to be noted that the first test state control signal is represented as the first test state control signal [M:0], the first preselection signal is represented as the first preselection signal [M:0], the first fixed level signal is represented as VDD[M:0], the first non-test state control signal is represented as the first non-test state control signal [M:0], and the first impedance control signal is represented as the first impedance control signal [M:0]. In this way, the 1st first data selector receives RTT_CODE[0], VDD[0] and DM_enable respectively, and selects one of RTT_CODE[0] and VDD[0] according to DM_enable to output the first preselection signal [0]. The 1st second data selector receives the first preselection signal [0], RONpu_CODE[0] and PODTM_DM_EN respectively, and selects one of the first preselection signal [0] and RONpu_CODE[0] according to PODTM_DM_EN to output the first test state control signal [0]. The 1st third data selector receives the first test state control signal [0], the first non-test state control signal [0] and PODTM_EN respectively, and selects one of the first test state control signal [0] and the first non-test state control signal [0] according to PODTM_EN to output the first impedance control signal [0]. Others may be understood by reference.

In some embodiments, the second impedance control signal includes M+1 bits of sub-signals, and the first calibration signal ZQ1_CODE[N−1:0] includes N bits of sub-signals. The first target signal includes a number A of groups of sub-signals, and each group of sub-signals includes N bits of sub-signals. The first group of signals in the first target signal are represented as PU1_MAIN_CODE 1[N−1:0], the second group of signals in the first target signal are represented as PU1_MAIN_CODE 2[N−1:0] . . . the A-th group of signals in the first target signal are represented as PU1_MAIN_CODE A[N−1:0]. The first driver 53 includes a number A of first impedance circuits, and each first impedance circuit is configured to receive a group of sub-signals in the first target signal PU1_MAIN_CODE, that is, the 1st first impedance circuit is configured to receive PU1_MAIN_CODE 1[N−1:0], the 2nd first impedance circuit is configured to receive PU1_MAIN_CODE 2[N−1:0] . . . the Ath first impedance circuit is configured to receive PU1_MAIN_CODE A[N−1:0].

As shown in FIG. 7 or FIG. 8, the first logic circuit 42 is specifically configured to determine whether the level pull-up function of the at least one first impedance circuit is enabled according to the first impedance control signal and the second impedance control signal; and determine, in a case where the level pull-up function of the a-th first impedance circuit is enabled, the level state of the a-th group of sub-signals in the first target signal PU1_MAIN_CODE according to the first calibration signal, so as to control the resistance value of the a-th first impedance circuit to be the standard resistance value; or, determine, in a case where the level pull-up function of the a-th first impedance circuit is disabled, that the a-th group of sub-signals in the first target signal PU1_MAIN_CODE are in the first level state (which may be determined according to the actual circuit logic and does not constitute a relevant limitation). Herein, a, N, and A are all integers, a is less than or equal to A, and M+1 is less than or equal to A.

It should be understood that for the first logic circuit 42, there is only one valid signal between the first impedance control signal and the second impedance control signal. In a case where M+1<A, the one bit of sub-signal in the valid signal controls whether the level pull-up function of one or more first impedance circuits is enabled. In addition, the plurality of first impedance circuits are in a parallel state, and each first impedance circuit may provide a standard resistance value RZQ. In this way, if the pull-up impedance of the DM pin 310 needs to be adjusted to RZQ/2, the level pull-up functions of the two first impedance circuits are enabled, and the level pull-up functions of the remaining first impedance circuits are disabled. If the pull-up impedance of the DM pin 310 needs to be adjusted to RZQ/3, the level pull-up functions of the three first impedance circuits are enabled, and the level pull-up functions of the remaining first impedance circuits are disabled. Other situations may be understood by reference.

Exemplarily, in a case where M+1=A=7, assuming that the valid signal between the first impedance control signal and the second impedance control signal is IMPpu_CODE [6:0], then IMPpu_CODE[0] controls the first impedance control signal, IMPpu_CODE[1] controls the 2nd first impedance circuit . . . IMPpu_CODE[6] controls the seventh first impedance circuit. Specifically, assuming that IMPpu_CODE[6:0]=1111111, the level values of each groups of sub-signals (Seven groups in total) in the first target signal are the same as the level value of the first calibration signal, so that the pull-up resistance values of the seven first impedance circuits are all RZQ, and the pull-up resistance of the DM pin 310 is RZQ/7. Assuming that IMPpu_CODE[6:0]=1111000, the level values of the first group of sub-signals to the third group of sub-signals in the first target signal are all in the first level state, and the level values of each group of sub-signals in the fourth group of sub-signals to the seventh group of sub-signals are all correspondingly the same as the level value of the first calibration signal, so that the first impedance circuit to the 3rd first impedance circuit are all disconnected. The pull-up resistance values of the 4th first impedance circuit to the seventh first impedance circuit are all RZQ, so that the pull-up impedance of the DM pin 310 is RZQ/4. Other situations may be understood by reference.

Exemplarily, in a case where M+1=4 and A=7, assuming that the valid signal between the first impedance control signal and the second impedance control signal is IMPpu_CODE[3:0], IMPpu_CODE[0] controls the 1st first impedance control signal, IMPpu_CODE[1] controls the 2nd first impedance circuit and the 3rd first impedance circuit, IMPpu_CODE[2] controls the 4th first impedance circuit and the fifth impedance circuit, and IMPpu_CODE[3] controls the sixth first impedance circuit and the seventh impedance circuit. Specifically, assuming that IMPpu_CODE[3:0]=1111, the level values of each group of sub-signals in the first target signal are the same as the level value of the first calibration signal, so that the pull-up resistance values of the seven first impedance circuits are all RZQ, and the pull-up resistance of the DM pin 310 is RZQ/7. Assuming that IMPpu_CODE[3:0]=1100, the level values of the first group of sub-signals to the third group of sub-signals in the first target signal are all in the first level state, and the level values of each group of sub-signals in the fourth group of sub-signals to the seventh group of sub-signals are all correspondingly the same as the level value of the first calibration signal, so that the first impedance circuit to the 3rd first impedance circuit are all disconnected. The pull-up resistance values of the 4th first impedance circuit to the seventh first impedance circuit are all RZQ, so that the pull-up impedance of the DM pin 310 is RZQ/4. Other situations may be understood by reference.

That is, if the level pull-up function of a certain first impedance circuit is enabled, the pull-up resistance value of the first impedance circuit is calibrated to the standard resistance value using the first calibration signal, otherwise if the level pull-up function of the first impedance circuit is disenabled, the related circuit of the first impedance circuit is disconnected using a fixed signal in the first level state.

In some embodiments, as shown in FIG. 7 or FIG. 8, each first impedance circuit includes N first switching transistors (for example, the first switching transistor 431 in FIG. 7 or FIG. 8), N second switching transistors (for example, the second switching transistor 432 in FIG. 7 or FIG. 8) and 2N first resistors (for example, the first resistor 433 in FIG. 7 or FIG. 8). A control terminal of the n-th first switching transistor in the a-th first impedance circuit is connected with the n-th sub-signal in the a-th group of sub-signals in the first target signal, a first terminal of one of the first switching transistors is connected with a first terminal of one of the first resistors, and a second terminal of the one of the first switching transistors is connected with a power signal. A control terminal of one of the second switching transistors is connected with a second fixed level signal, a first terminal of the one of the second switching transistors is connected with the ground signal VSS, a second terminal of one of the second switching transistors is connected with a first terminal of one of the first resistors, and the second terminals of the 2N first resistors are all connected with the DM pin 310. Herein, n is less than or equal to N.

It should be understood that since the DM pin 310 does not support the Read function and does not need to enable the level pull-down function, the second switching transistor is turned off using the second fixed level signal, and its specific value may be determined according to the actual circuit conditions.

It is to be noted that in FIG. 7 or FIG. 8, taking the 1st first impedance circuit as an example, the 1st first impedance circuit is configured to receive the first group of sub-signals PU1_MAIN_CODE 1[N−1:0] in the first target signal. PU1_MAIN_CODE 1[N−1:0] includes N sub-signals of PU1_MAIN_CODE_1[0], PU1_MAIN_CODE_1[1] . . . PU1_MAIN_CODE 1[N−1]. Each sub-signal is configured to control the working state of one of first switching transistors correspondingly, so as to control the first impedance circuit to perform the level pull-up function with the standard resistance value or not perform the level pull-up function.

In addition, in FIG. 7 or FIG. 8, the 1st first impedance circuit shows the three first switching transistors (only one first switching transistor 431 is numbered), three second switching transistors (only one second switching transistor 432 is numbered), and six first resistors (only one first resistor 433 is numbered), but in actual scenarios, the number of the first switching transistors/second switching transistors/first resistors may all be more or less.

It should be understood that the DM pin 310 only supports the data write function and provides the termination impedance, so that it is not necessary to perform the level pull-down function. Therefore, the first terminals of all the second switching transistors are connected with the second fixed level signal, that is, all the second switching transistors are not conductive. Exemplarily, the second fixed level signal may be the ground signal VSS, but its specific level value needs to be determined according to the circuit logic, which is not limited in the embodiment of the present disclosure.

The specific structure description of the second driver circuit 321 is exemplarily provided below. It should be understood that although some signals in the second driver circuit 321 and some signals in the first driver circuit 311 have different Chinese names, the sources and waveforms of the signals are basically the same, so the same English names are used.

In the embodiment of the present disclosure, the semiconductor memory 30 is further configured to determine a third non-test state control signal, a fourth impedance control signal, a fifth impedance control signal, a second calibration signal ZQ2 CODE[N−1:0] and a third calibration signal ZQ3 CODE[N−1:0].

Figure 9:
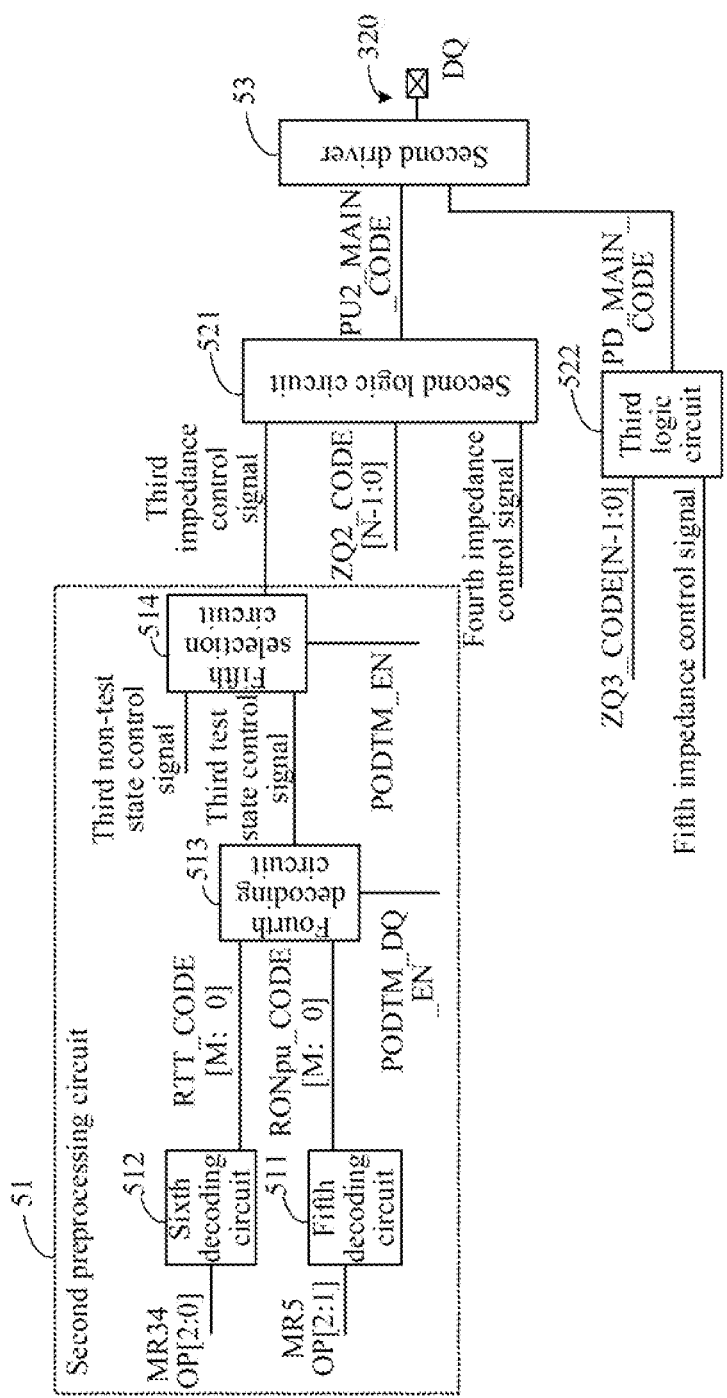
FIG. 9 is a schematic structural diagram of a second driver circuit according to an embodiment of the present disclosure.

As shown in FIG. 9, the second driver circuit 421 may include a second signal processing circuit 51, a second logic circuit 521, a third logic circuit 522, and a second driver 53.

The second signal processing circuit 51 is configured to receive the second test flag signal PODTM_DQ_EN (for example, aforementioned PODTM_DQ0_EN, or PODTM_DQ1_EN . . . PODTM_DQ7_EN), the first OP MR5 OP[2:1], the second OP MR34 OP[2:0] and the third non-test state control signal; and output, based on one of the first OP MR5 OP[2:1] and the second OP MR34 OP[2:0], a third impedance control signal according to the second test flag signal PODTM_DQ_EN when the semiconductor memory 30 is in the preset test mode; or, output, based on the third non-test state control signal, the third impedance control signal when the semiconductor memory 30 is not in the preset test mode.

The second logic circuit 521 is configured to receive the third impedance control signal, the fourth impedance control signal and the second calibration signal ZQ2 CODE[N−1:0]; and select and logically combine the fourth impedance control signal and the second calibration signal ZQ2 CODE[N−1:0] to output a second target signal PU2_MAIN_CODE.

The third logic circuit 522 is configured to receive the fifth impedance control signal and the third calibration signal ZQ3 CODE[N−1:0]; and logically combine the fifth impedance control signal and the third calibration signal ZQ3 CODE[N-1:0] to output a third target signal PD_MAIN_CODE.

The second driver 53 includes a plurality of second impedance circuits and is configured to receive the second target signal PU2_MAIN_CODE and the third target signal PD_MAIN_CODE; and control the plurality of second impedance circuits using the second target signal PU2_MAIN_CODE and the third target signal PD_MAIN_CODE, so as to control the impedance of the corresponding DQ pin 320.

It is to be noted that each DQ pin 320 corresponds to the respective second driver circuit 321, and the embodiment of the present disclosure only takes one second driver circuit 321 as an example for explanation.

It should be understood that the DQ pin 320 supports the Write function and the Read function, and involves the level pull-up function and the level pull-down function at the same time. Therefore, there are not only the third impedance control signal and the third impedance control signal which are configured to control the level pull-up function in the second driver circuit 321, but also the fifth impedance control signal configured to control the level pull-down function.

It is to be noted that the second calibration signal ZQ2 CODE[N-1:0] is configured calibrate the pull-up resistance value, that is, the second calibration signal ZQ2 CODE[N-1:0] is configured to calibrate the pull-up resistance value of each second impedance circuit to the standard resistance value. The third calibration signal ZQ3 CODE[N-1:0] is configured to calibrate the pull-down resistance value, that is, the third calibration signal ZQ3 CODE[N-1:0] is configured to calibrate the pull-down resistance value of each second impedance circuit to the standard resistance value.

In addition, since the first calibration signal ZQ1_CODE[N-1:0] and the second calibration signal ZQ2 CODE[N-1:0] are both configured to calibrate the pull-up resistance value, in some embodiments, it may be considered that the deviations of the first impedance circuit and the second impedance circuit are within the allowable error range, so that the first calibration signal ZQ1_CODE[N-1:0] and the second calibration signal ZQ2 CODE[N-1:0] may be the same signal.

It is also to be noted that for the second driver circuit 321, the valid signal between the third impedance control signal and the fourth impedance control signal and the second calibration signal ZQ2 CODE[N-1:0] are combined through the second logic circuit 521, so as to form the second target signal PU2_MAIN_CODE configured to control the level pull-up function of the second impedance circuit 53. The circuit structure and signal processing process of this part of the circuit may be correspondingly understood with reference to the first driver circuit 311, which is not repeated here. In addition, the second driver circuit 321 also combines the fifth impedance control signal and the third calibration signal ZQ3_CODE[N-1:0] through the third logic circuit 522, so as to form the third target signal PD_MAIN_CODE configured to control the level pull-down function of the second impedance circuit 53.

In some embodiments, as shown in FIG. 9, the second signal processing circuit 51 may include a fifth decoding circuit 511, a sixth decoding circuit 512, a fourth selection circuit 513, and a fifth selection circuit 514.

The fifth decoding circuit 511 is configured to receive the first OP MR5 OP[2:1], decode the first OP MR5 OP[2:1] and output a third decoded signal RONpu_CODE[M:0].

The sixth decoding circuit 512 is configured to receive the second OP MR34 OP[2:0], decode the second OP MR34 OP[2:0] and output a fourth decoded signal RTT_CODE[M:0].

The fourth selection circuit 513 is configured to receive the second test flag signal PODTM_DQ_EN, the third decoded signal RONpu_CODE[M:0] and the fourth decoded signal RTT_CODE[M:0]; and select one of the third decoded signal RONpu_CODE[M:0] and the fourth decoded signal RTT_CODE[M:0] according to the second test flag signal PODTM_DQ_EN to output a third test state control signal.

The fifth selection circuit 514 is configured to receive the test enable signal PODTM_EN, the third test state control signal and the third non-test state control signal; and select one of the third test state control signal and the third non-test state control signal according to the test enable signal PODTM_EN to output the third impedance control signal. Herein, the test enable signal PODTM_EN is configured to indicate whether the semiconductor memory 30 is in the preset test mode.

For the second driver circuit 321 shown in FIG. 9, according to the different definitions of the third non-test state control signal and the fourth impedance control signal, there may be two specific implementation modes.

In one embodiment, the third non-test state control signal is configured to indicate the impedance of the corresponding DQ pin in a termination state, and the fourth impedance control signal and the fifth impedance control signal are joint configured to indicate the impedance of the corresponding DQ pin in the output driver state. That is, by merging the signal control strategy of the DQ pin in the PODTM into the signal control strategy of the write-related attribute, the impedance control of the PODTM is realized.

Figure 10:
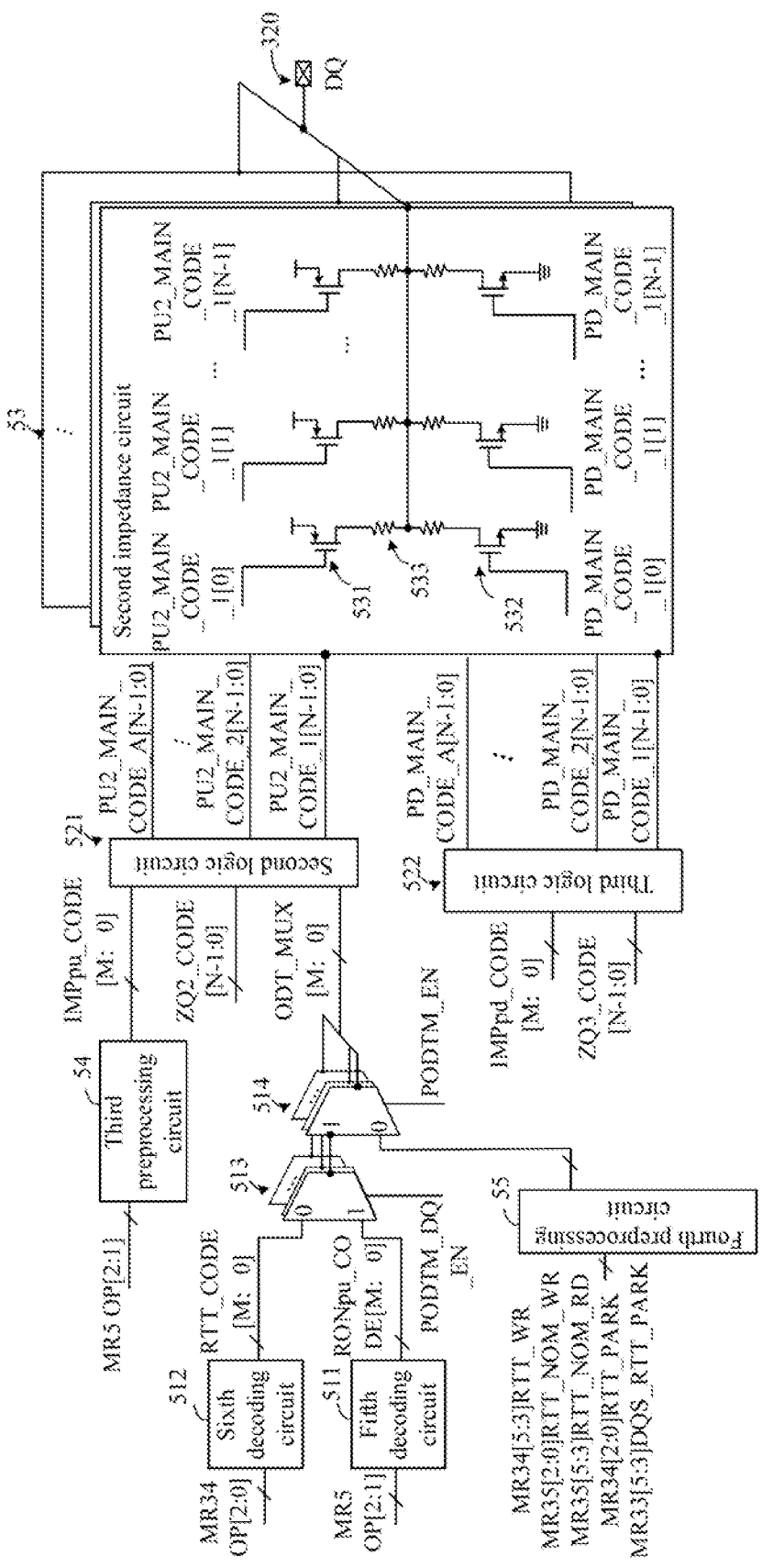
FIG. 10 is a detailed schematic structural diagram I of a second driver circuit according to an embodiment of the present disclosure.

Correspondingly, as shown in FIG. 10, the third impedance control signal is represented by ODT_MUX[M:0], the fourth impedance control signal is represented by IMPpu_CODE[M:0], and the fifth impedance control signal is represented by IMPpd_CODE[M:0]. Particularly, compared with FIG. 9, the second driver circuit 321 in FIG. 10 further includes a third preprocessing circuit 54 and a fourth preprocessing circuit 55. The third preprocessing circuit 54 is configured to decode the first OP MR5 OP[2:1] to obtain the fourth impedance control signal IMPpu_CODE[M:0]. The fourth preprocessing circuit 55 is configured to determine the third non-test state control signal according to MR34[5:3] involving RTT_WR, MR35[2:0] involving RTT_NOM_WR, MR35[5:3] involving RTT_NOM_RD, MR34[2:0] involving RTT_PARK, and MR33[5:3] involving DQS_RTT_PARK. In addition, in the following description, if the semiconductor memory 30 is in the PODTM, the test enable signal PODTM_EN is logic "1". If the semiconductor memory 30 is not in the PODTM, the test enable signal PODTM_EN is logic "0". If the corresponding DQ pin 320 is the test object of the PODTM, the corresponding first test flag signal PODTM_DQ_EN is logic "1". If the corresponding DQ pin 320 is not the test object of the PODTM, the corresponding first test flag signal PODTM_DQ_EN is logic "0".

Here, the basic working principle of the second driver circuit 321 in FIG. 10 is substantially the same as that of the first driver circuit 311 in FIG. 7, which may be understood with reference to the foregoing description of FIG. 7 and may not repeated in this embodiment of the present disclosure. Particularly, since the DQ pin 320 is generally enabled in the normal working mode, the signal configured to control where the DQ pin 320 is enabled is not set in the DDR5

SPEC, so that compared with the first driver circuit 311 in FIG. 7, the second driver circuit 321 in FIG. 10 has one less selection circuit. In addition, compared with the first driver circuit 311 in FIG. 7, the second driver circuit 321 in FIG. 10 has one more control part of the level pull-down impedance, and its signal processing principle may refer to the following description. In addition, since the DQ pin 320 supports the Write function and the Read function, in the non-PODTM, it is necessary to determine whether the third impedance control signal is valid or the fourth impedance control signal is valid according to the actual work requirements, and then the second target signal PU2_MAIN_CODE is obtained by logically combining with the second calibration signal ZQ2_CODE[M:0] using the valid signal.

In another embodiment, the third non-test state control signal and the fifth non-test state control signal are jointly configured to indicate the impedance of the corresponding DQ pin in the output driver state, and the fourth impedance control signal is configured to indicate the impedance of the corresponding DQ pin in the termination state. That is, by merging the signal control strategy of the DQ pin in the PODTM into the signal control strategy of the read-related attribute, the impedance control of the PODTM is realized.

Figure 11:
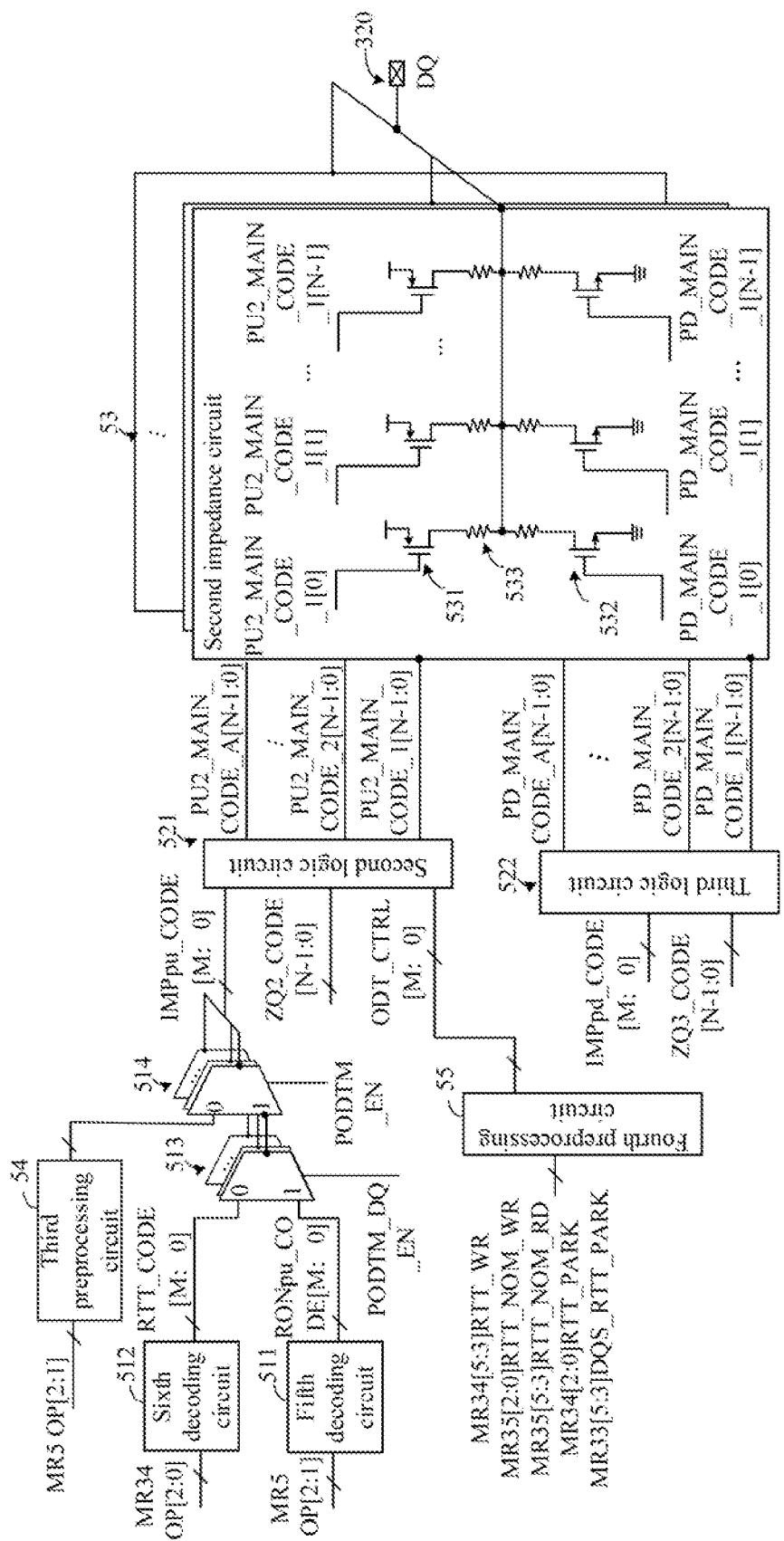
FIG. 11 is a detailed schematic structural diagram II of a second driver circuit according to an embodiment of the present disclosure.

Correspondingly, as shown in FIG. 11, the third impedance control signal is represented by IMPpu_CODE[M:0], the fourth impedance control signal is represented by ODT_CTRL[M:0], and the fifth impedance control signal is represented by IMPpd_CODE[M:0]. Particularly, compared with FIG. 9, the semiconductor memory 30 in FIG. 11 also includes the third preprocessing circuit 54 and the fourth preprocessing circuit 55.

Here, the working principle of the second driver circuit 321 in FIG. 11 is substantially the same as that of the first driver circuit 311 in FIG. 8, which may be correspondingly understood with reference to the foregoing description of FIG. 8 and may not repeated in this embodiment of the present disclosure. Similarly, compared with the second driver circuit 321 in FIG. 11, the first driver circuit 311 in FIG. 8 has one less selection circuit. Compared with the first driver circuit 311 in FIG. 8, the second driver circuit 321 in FIG. 11 has one more control part of the level pull-down impedance, and its signal processing principle may refer to the following description. In addition, since the DQ pin 320 supports the Write function and the Read function, in the non-PODTM, it is necessary to determine whether the third impedance control signal is valid or the fourth impedance control signal is valid according to the actual work requirements, and then the second target signal PU2_MAIN_CODE is obtained by logically combining with the second calibration signal ZQ2_CODE[M:0] using the valid signal.

The signal processing process in the second driver circuit 321 will be described below with reference to FIG. 10 or FIG. 11.

In some embodiments, each of the third decoded signal RONpu_CODE[M:0], the fourth decoded signal RTT_CODE[M:0], the third test state control signal, the third non-test state control signal and the third impedance control signal includes −M+1 bits of sub-signals. The fourth selection circuit 513 includes M+1 fourth data selectors. The fifth selection circuit 514 includes M+1 fifth data selectors. Herein, the input terminal of one fourth data selector receives one bit of sub-signal of the third decoded signal RONpu_CODE[M:0] and one bit of sub-signal of the fourth decoded signal RTT_CODE[M:0], the output terminal of one fourth data selector is configured to output one bit of sub-signal of the third test state control signal, and the control terminals of all the fourth data selectors receive the second test flag signal PODTM_DQ_EN. The input terminal of one fifth data selector receives the one bit of sub-signal of the third test state control signal and one bit of sub-signal of the third non-test state control signal, the output terminal of one fifth data selector is configured to output one bit of sub-signal of the third impedance control signal, and the control terminals of all the fifth data selectors receive the test enable signal PODTM_EN.

It is to be noted that the third test state control signal is represented as the third test state control signal [M:0], the third non-test state control signal is represented as the third non-test state control signal [M:0], and the third impedance control signal is represented as the third impedance control signal [M:0]. In this way, the 1st fourth data selector receives RONpu_CODE[0], RTT_CODE[0] and PODTM_DQ_EN respectively, and selects one of RONpu_CODE[0] and RTT_CODE[0] according to PODTM_DQ_EN to output the third test state control signal [0]. The 1st fifth data selector receives the third test state control signal [0], the third non-test state control signal [0] and PODTM_EN respectively, and selects one of the third test state control signal [0] and the third non-test state control signal [0] according to PODTM_EN to output the third impedance control signal [0]. Others may be understood by reference and analogy.

In some embodiments, the fourth impedance control signal includes M+1 bits of sub-signals. Each of the second calibration signal ZQ2_CODE[N−1:0] and the third calibration signal ZQ3_CODE[N−1:0] includes N bits of sub-signals. Each of the second target signal PU2_MAIN_CODE and the third target signal PD_MAIN_CODE includes a number A of groups of sub-signals. Each group of sub-signals includes N bits of sub-signals. Here, the second driver 53 includes a number A of second impedance circuits, and each second impedance circuit is configured to receive a group of sub-signals in the second target signal PU2_MAIN_CODE and a group of sub-signals in the third target signal PD_MAIN_CODE. That is, the 1st second impedance circuit is configured to receive PU2_MAIN_CODE 1[N−1:0] and PD_MAIN_CODE 1[N−1:0], and the 2nd second impedance circuit is configured to receive PU2_MAIN_CODE 2[N−1:0] and PD_MAIN_CODE 2[N−1:0] the A-th second impedance circuit is configured to receive PU2_MAIN_CODE A[N−1:0] and PD_MAIN_CODE A[N−1:0].

Herein, the second logic circuit 521 is specifically configured to determine whether the level pull-up function of the at least one second impedance circuit is enabled according to the third impedance control signal and the fourth impedance control signal; and determine, in a case where the level pull-up function of the a-th second impedance circuit is enabled, the level state of the a-th group of sub-signals in the second target signal PU2_MAIN_CODE according to the second calibration signal ZQ2_CODE[N−1:0], so as to control the resistance value of the second impedance circuit to be a standard resistance value; or, determine, in a case where the level pull-up function of the a-th second impedance circuit is disabled, that the a-th group of sub-signals in the second target signal PU2_MAIN_CODE are in the first level state. The third logic circuit 522 is specifically configured to determine whether the level pull-up function of the at least one second impedance circuit is enabled according to the fifth impedance control signal; and determine, in a case where the level pull-down function of the a-th second impedance circuit is enabled, the level state of the a-th group of sub-signals in the third target signal PD_MAIN_CODE according to the third calibration signal ZQ3_CODE[N−1:0], so as to control the resistance value of the second impedance circuit to be a standard resistance value; or, determine, in a case where the level pull-down function of the a-th second impedance circuit is disabled, that the a-th group of sub-signals in the third target signal PD_MAIN_CODE are in the second level state.

It is to be noted that the valid signal between the third impedance control signal and the fourth impedance control signal and the second calibration signal ZQ2_CODE[N−1:0] are combined through the second logic circuit 521, so as to obtain the second target signal PU2_MAIN_CODE, thereby controlling the level pull-up function of the second impedance circuit. The structure and function of the second logic circuit 521 are substantially the same as those of the first logic circuit 42, and the working principle of the second logic circuit 521 may refer to the above description of the first logic circuit 42 and may not be repeated here.

The third logic circuit 522 is configured to combine the fifth impedance control signal IMPpd_CODE[M:0] and the third calibration signal ZQ3_CODE[N−1:0] to obtain the third target signal PD_MAIN_CODE, so as to control the level pull-down function of the second impedance circuit. Similarly, the one bit of sub-signal of the fifth impedance control signal IMPpd_CODE[M:0] controls whether the level pull-down function of one or more second impedance circuits is enabled. On this basis, if the level pull-down function of a certain second impedance circuit function is enabled, the pull-down resistance value of the second impedance circuit is calibrated to the standard resistance value using the third calibration signal ZQ3_CODE[N−1:0], so that the level pull-down function is performed, otherwise if the level pull-down function of the second impedance circuit is disenabled, the related circuit of the second impedance circuit is disconnected using a fixed signal in the second level state.

In some embodiments, each second impedance circuit includes N third switching transistors (for example, the third switching transistor 531 in FIG. 10 or FIG. 11), N fourth switching transistors (for example, the fourth switching transistor 532 in FIG. 10 or FIG. 11) and 2N second resistors (for example, the second resistor 533 in FIG. 10 or FIG. 11). The control terminal of the n-th second switching transistor in the a-th third impedance circuit is connected with the n-th sub-signal in the a-th group of sub-signals in the second target signal, the first terminal of one third switching transistor is connected with a first terminal of one of the second resistors, and a second terminal of one third switching transistor is connected with a power signal. The control terminal of the n-th fourth switching transistor in the a-th second impedance circuit is connected with the n-th sub-signal in the a-th group of sub-signals in the third target signal, the first terminal of one fourth switching transistor is connected with the ground signal, the second terminal of one fourth switching transistor is connected with the first terminal of one of the second resistors, and second terminals of the 2N second resistors are all connected with the DQ pin.

It is to be noted that in FIG. 10 or FIG. 11, taking the 1st second impedance circuit as an example, the 1st second impedance circuit is configured to receive the first group of sub-signals PU2_MAIN_CODE 1[N−1:0] in the second target signal and the first group of sub-signals PD_MAIN_CODE 1[N−1:0] in the third target signal. Herein, PU2_MAIN_CODE 1[N−1:0] includes sub-signals of PU2_MAIN_CODE 1[0], PU2_MAIN_CODE 1[1] . . . PU2_MAIN_CODE 1[N−1], and each sub-signal is configured to correspondingly control the working state of one third switching transistor, so as to control the second impedance circuit to perform the level pull-up function with the standard resistance value or not perform the level pull-up function. PD_MAIN_CODE 1[N−1:0] includes sub-signals of PD_MAIN_CODE 1[0], PD_MAIN_CODE 1[1] . . . PD_MAIN_CODE 1[N−1], and sub-signal is configured to correspondingly control the working state of one fourth switching transistor, so as to control the second impedance circuit to perform the level pull-down function with the standard resistance value or not perform the level pull-down function.

In addition, in FIG. 10 or FIG. 11, the 1st second impedance circuit shows the three third switching transistors (only one third switching transistor 531 is numbered), three fourth switching transistors (only one fourth switching transistor 532 is numbered) and six second resistors (only one second resistor 533 is numbered), but in actual scenarios, the number of the third switching transistors/fourth switching transistors/second resistors may all be more or less.

In the feasible circuit logic, the first level state is a high level state (logic "1"), and the second level state is a low level state (logic "0"). The high-level state is a level value which makes a N-channel field effect transistor be conductive or a P-channel field effect transistor be non-conductive. The low-level state is a level value which makes the N-channel field effect transistor be non-conductive or the P-channel field effect transistor be conductive.

The sub-signals in the first fixed level signal are all high-level signals, and the second fixed level signal is a low level signal. Here, the selection of the first fixed level signal and the second fixed level signal is determined according to the circuit logic, the first fixed level signal may be the power signal VDD, and the second fixed level signal may be the ground signal VSS.

The first switching transistor and the third switching transistor are both P-channel field effect transistors, and the second switching transistor and the fourth switching transistor are both N-channel field effect transistors. The control terminal of the P-channel field effect transistor is a gate, the second terminal of the P-channel field effect transistor is a source, the first terminal of the P-channel field effect transistor is a drain, a control terminal of the N-channel field effect transistor is the gate, the second terminal of the N-channel field effect transistor is the drain, and the first terminal of the N-channel field effect transistor is the source. The standard resistance values are all 240 ohms.

The embodiments of the present disclosure provide the semiconductor memory. since both the third OP and the fourth OP may affect the impedance state of the DM pin to avoid the circuit processing errors, the following impedance control strategy is provided: if the third OP meets the first decoding condition, the impedance of the DM pin is directly determined. if the third OP meets the second decoding condition, the impedance of the DM pin is determined in combination with the fourth OP. In this way, the impedance of the DM pin may be tested in the preset test mode to avoid the circuit processing errors. the relation between the control signal configured to control whether the DM pin is enabled in the DDR5 and the control signal configured to control whether the DM pin is the test object in the PODTM is specified. The impedance of the DM pin may be tested in the preset test mode to avoid the circuit processing errors.

In another embodiment of the present disclosure, another implementation mode for S102 is provided. Particularly, the first value is a second impedance parameter, and the first decoding condition indicates that the DM pin is not the test object in the preset test mode. The operation that the impedance of the DM pin is controlled to be a first value includes the following operation.

A second OP in the second MR is decoded, and the impedance of the DM pin is controlled to be the first impedance parameter according to a decoding result;

Herein, the semiconductor memory further includes at least one DQ pin. The DQ pin is configured to receive or output data. The second OP is configured to indicate that the impedance of the at least one DQ pin in a termination state is the second impedance parameter.

In some embodiments, the second value includes a first impedance parameter and a high impedance state. The second decoding condition indicates that the DM pin is the test object in the preset test mode. The operation that the impedance of the DM pin is controlled to be a second value according to the fourth OP includes the following operations.

In a case where the fourth OP meets a third decoding condition, a first OP in the first MR is decoded, and the impedance of the DM pin is controlled to be a first impedance parameter according to the decoding result. The third decoding condition indicates that the DM pin is enabled.

In a case where the fourth OP meets a fourth decoding condition, the impedance of the DM pin is controlled to be in the high impedance state through a first fixed level signal. The fourth decoding condition indicates that the DM pin is disabled.

Herein, the first OP is configured to indicate that the impedance of the at least one DQ pin in an output driver state is the first impedance parameter.

In some embodiments, the method further includes the following operations.

The first OP and the fourth OP stored in the first MR, the second OP stored in the second MR and the third OP stored in the third MR are acquired.

The third OP and the fourth OP are decoded respectively to obtain a first test flag signal and an enable control signal.

When the semiconductor memory is in the preset test mode, in a case where the first test flag signal is in a second level state, the impedance of the DM pin is controlled through the second OP; or, in a case where the first test flag signal is in a first level state, the first OP or the first fixed level signal is selected according to a level state of the enable control signal to control the impedance of the DM pin.

Herein, when the third OP meets the first decoding condition, the first test flag signal is in the second level state. When the third OP meets the second decoding condition, the first test flag signal is in the first level state. When the fourth OP meets the third decoding condition, the enable control signal is in the first level state. When the fourth OP meets the fourth decoding condition, the enable control signal is in the second level state.

Combined with Table 5, the signal control strategy in the preset test mode is described in detail.

TABLE 5

| PODTM_EN | DM_enable | PODTM_DM_EN | DM | DQ |
|---|---|---|---|---|
| 1 | 0 | 0 | RTT_PARK (MR34 OP[2:0]) | Test object: RONpu (MR5 OP[2:1]) Non-test object: RTT_PARK (MR34 OP[2:0]) |
| 1 | 0 | 1 | Hi-Z | RTT PARK (MR34 OP[2:0]) |

TABLE 5-continued

| PODTM_EN | DM_enable | PODTM_DM_EN | DM | DQ |
|---|---|---|---|---|
| 1 | 1 | 0 | RTT_PARK (MR34 OP[2:0]) | Test object: RONpu (MR5 OP[2:1]) Non-test object: RTT_PARK (MR34 OP[2:0]) |
| 1 | 1 | 1 | RONpu (MR5 OP[2:1]) | RTT_PARK (MR34 OP[2:0]) |

As shown in Table 5, after entering the PODTM (PODTM_EN=1), the following situations are classified.

(1) For the DM pin, if the first test flag signal PODTM_DM_EN is logic "0", no matter what state the enable control signal DM_enable is in, the DM pin is not the test object, and its impedance is the second impedance parameter RTT_PARK, which is specifically controlled by the first OP MR5 OP[2:1]. For the DQ pin, the impedance of the DQ pin selected as the test object is the first impedance parameter, which is specifically controlled by the first OP MR5 OP[2:1]. The impedance of the DQ pin unselected as the test object is the second impedance parameter, which is specifically controlled by the second OP MR34 OP[2:0].

(2) For the DM pin, if the first test flag signal PODTM_DM_EN is logic "1", and the enable control signal DM_enable is logic "1", it means that the DM pin is the test object and is enabled, and its impedance is the first impedance parameter RONpu, which is specifically controlled by the first OP MR5 OP[2:1]. For the DQ pins, all the DQ pins are not the test object, so that the impedances of the DQ pins are all the second impedance parameter RTT_PARK, which is specifically controlled by the second OP MR34 OP[2:0].

(3) For the DM pin, if the first test flag signal PODTM_DM_EN is logic "1", and the enable control signal DM_enable is logic "0", it means that the DQ pin is selected as the test object but disabled, the DM pin is controlled to be in the high impedance state Hi-Z. For the DQ pins, all the DQ pins are not the test object, so that the impedances of the DQ pins are all the second impedance parameter RTT_PARK, which is specifically controlled by the second OP MR34 OP[2:0].

In this way, the embodiments of the present disclosure provide the impedance control strategy for the DM pin in the PODTM mode, which may test the impedance of the DM pin in the PODTM to avoid circuit errors.

In addition, for the implementation mode of S102, another implementation mode for the first driver circuit 311 in the semiconductor memory 30 is also provided. Particularly, the first decoding condition indicates that the DM pin is not the test object in the preset test mode, the second decoding condition indicates that the DM pin is the test object in the preset test mode, the first value is a second impedance parameter, and the second value includes a first impedance parameter and a high impedance state.

The first driver circuit 311 is specifically configured to decode a second OP in the second MR in a case where the third OP meets the first decoding condition, and control the impedance of the DM pin to be the second impedance parameter according to the decoding result; or, decode a first OP in the first MR in a case where the third OP meets the second decoding condition and the fourth OP meets a third decoding condition, and control the impedance of the DM pin to be the first impedance parameter according to the decoding result; or, control, in a case where the third OP meets the second decoding condition and the fourth OP meets a fourth decoding condition, the impedance of the DM pin to be in the high impedance state through a first fixed level signal. The third decoding condition indicates that the DM pin is enabled, and the fourth decoding condition indicates that the DM pin is disabled.

The specific structure description of another first driver circuit 311 is exemplarily provided below.

In the embodiment of the present disclosure, the semiconductor memory 30 is further configured to determine a first non-test state control signal, a second impedance control signal and a first calibration signal ZQ1_CODE[N−1:0]. The first calibration signal ZQ1_CODE[N−1:0] is configured to calibrate the pull-up resistance value.

Figure 12:
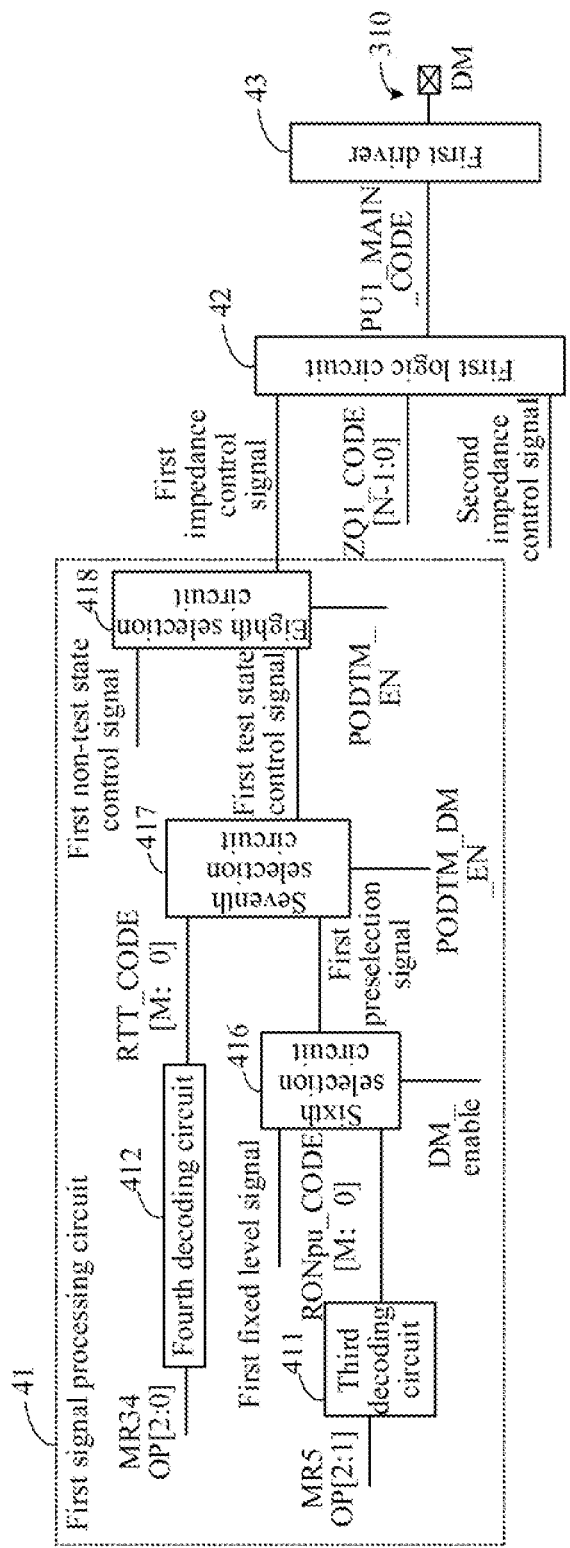
FIG. 12 is a schematic structural diagram of another first driver circuit according to an embodiment of the present disclosure.

As shown in FIG. 12, the first driver circuit 311 may include a first signal processing circuit 41, a first logic circuit 42, and a first driver 43.

The first signal processing circuit 41 is configured to receive the first test flag signal PODTM_DM_EN, the enable control signal DM_enable, the first fixed level signal, the first OP MR5 OP[2:1], the second OP MR34 OP[2:0] and the first non-test state control signal; and output, based on one of the first fixed level signal, the first OP MR5 OP[2:1] and the second OP MR34 OP[2:0], a first impedance control signal according to a level state of the first test flag signal PODTM_DM_EN and the level state of the enable control signal DM_enable when the semiconductor memory is in the preset test state; or, output, based on the first non-test state control signal, the first impedance control signal when the semiconductor memory is not in the preset test mode.

The first logic circuit 42 is configured to receive the first impedance control signal, the second impedance control signal and the first calibration signal ZQ1_CODE[N−1:0]; and select and logically combine the first impedance control signal, the second impedance control signal and the first calibration signal ZQ1_CODE[N−1:0] to output a first target signal PU1_MAIN_CODE.

The first driver 43 includes a plurality of first impedance circuits and configured to receive the first target signal PU1_MAIN_CODE, and control the plurality of first impedance circuits using the first target signal PU1_MAIN_CODE, so as to control the impedance of the DM pin 310.

In some embodiments, as shown in FIG. 12, the first signal processing circuit 41 includes a third decoding circuit 411, a fourth decoding circuit 412, a sixth selection circuit 416, a seventh selection circuit 417 and an eighth selection circuit 418.

The third decoding circuit 411 is configured to receive the first OP MR5 OP[2:1], decode the first OP MR5 OP[2:1] and output a first decoded signal RONpu_CODE[M:0].

The fourth decoding circuit 412 is configured to receive the second OP MR34 OP[2:0], decode the second OP MR34 OP[2:0] and output a second decoded signal RTT_CODE[M:0].

The sixth selection circuit 416 is configured to receive the enable control signal DM_enable, the first decoded signal RONpu_CODE[M:0] and the first fixed level signal; and select one of the first decoded signal RONpu_CODE[M:0] and the first fixed level signal according to a level state of the enable control signal DM_enable to output a first preselection signal.

The seventh selection circuit 417 is configured to receive the first test flag signal PODTM_DM_EN, the first preselection signal and the second decoded signal RTT_CODE[M:0]; and select one of the first preselection signal and the second decoded signal RTT_CODE[M:0] according to a level state of the first test flag signal PODTM_DM_EN to output the first test state control signal.

The eighth selection circuit 418 is configured to receive the test enable signal DM_enable, the first test state control signal and the first non-test state control signal; and select one of the first test state control signal and the first non-test state control signal according to a level state of the test enable signal DM_enable to output the first impedance control signal. Herein, the test enable signal is configured to indicate whether the semiconductor memory is in the preset test mode.

For the first driver circuit 311 shown in FIG. 12, according to the different definitions of the first non-test state control signal and the second impedance control signal, there may be two specific implementation modes.

Figure 13:
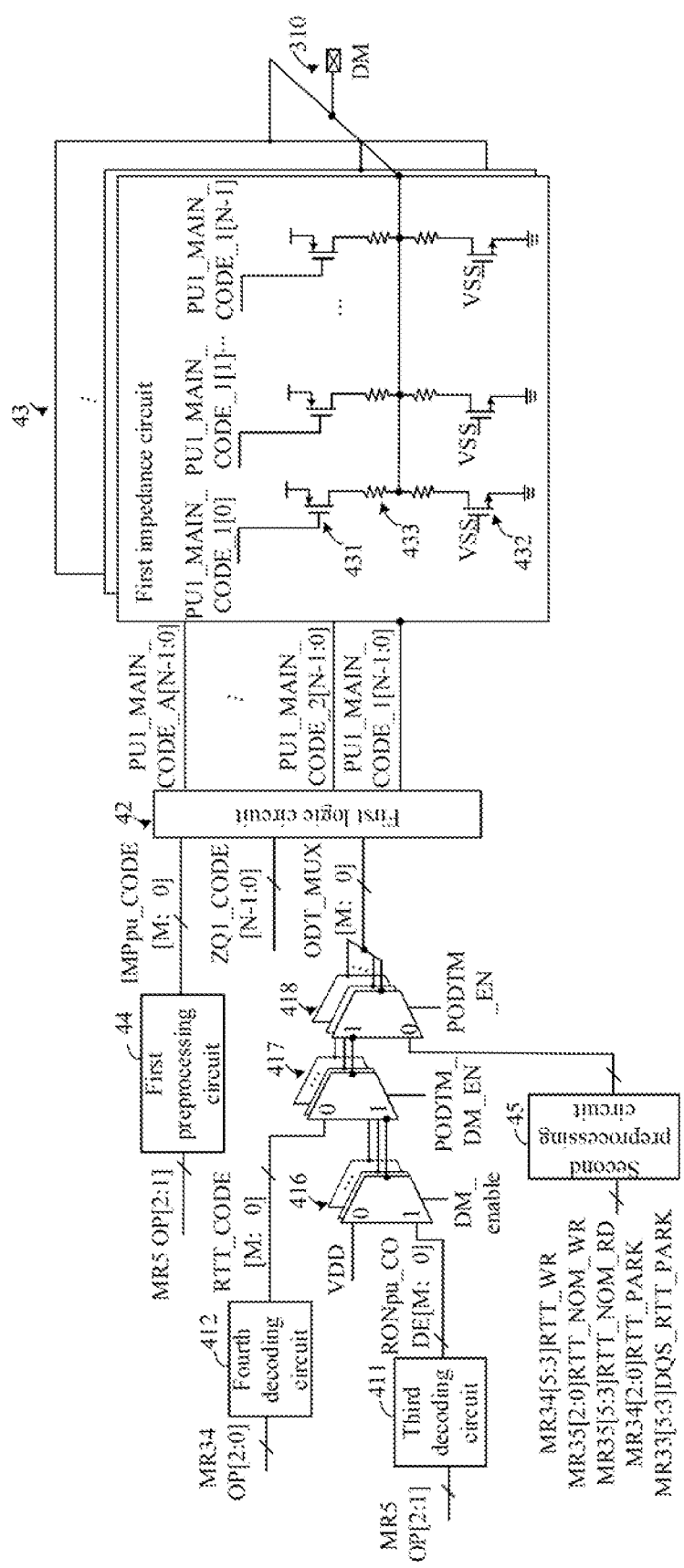
FIG. 13 is a detailed schematic structural diagram I of another first driver circuit according to an embodiment of the present disclosure.

In one embodiment, the first non-test state control signal is configured to indicate the impedance of the DM pin in a state in the state other than the preset test state, and the second impedance control signal is configured to indicate the impedance of the DQ pin in the output driver state. That is, by merging the signal control strategy of the DM pin in the PODTM into the signal control strategy of the write-related attribute, the impedance control of the PODTM is realized. Correspondingly, as shown in FIG. 13, the first impedance control signal is represented by ODT_MUX[M:0], and the second impedance control signal is represented by IMPpu_CODE[M:0]. The working principle of the circuit shown in FIG. 13 may be understood with the reference to the working principle of the circuit shown in FIG. 7, which may not be repeated here.

Figure 14:
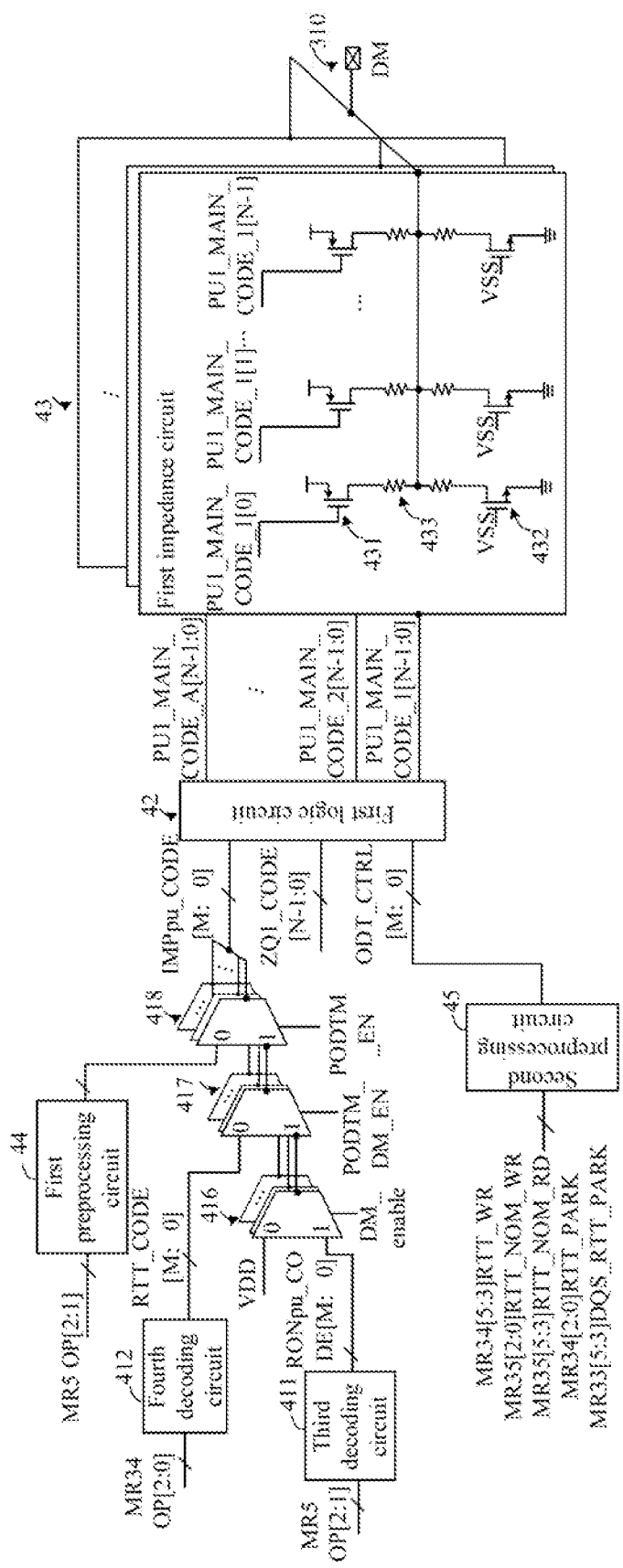
FIG. 14 is a detailed schematic structural diagram II of another first driver circuit according to an embodiment of the present disclosure.

In another embodiment, the first non-test state control signal is configured to indicate the impedance of the DM pin in the output driver state, and the second impedance control signal is configured to indicate the impedance of the DQ pin in the state other than the preset test state. That is, by merging the signal control strategy of the DM pin in the PODTM into the signal control strategy of the read-related attribute, the impedance control of the PODTM is realized. Correspondingly, as shown in FIG. 14, the first impedance control signal is represented by IMPpu_CODE[M:0], and the second impedance control signal is represented by ODT_MUX[M:0]. The working principle of the circuit shown in FIG. 14 may be understood with the reference to the working principle of the circuit shown in FIG. 8, which may not be repeated here.

Embodiments of the present disclosure provide the semiconductor memory. The relation between the control signal configured to control whether the DM pin is enabled in the DDR5 and the control signal configured to control whether the DM pin is the test object in the PODTM is specified. The impedance of the DM pin may be tested in the preset test mode to avoid the circuit processing errors.

Figure 15:
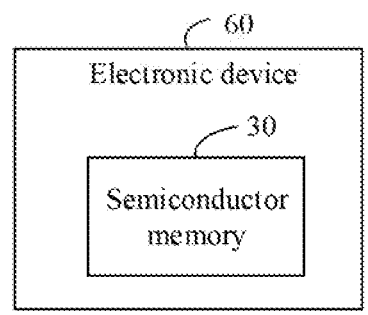
FIG. 15 is a schematic diagram of a composition structure of an electric device according to an embodiment of the present disclosure.

In yet another embodiment of the preset disclosure, referring to FIG. 15, which shows a schematic diagram of a composition structure of an electronic device 60 according to an embodiment of the present disclosure. As shown in FIG. 15, the electronic device 60 may include the semiconductor memory 30 described in any one of the foregoing embodiments.

In the embodiment of the present disclosure, the semiconductor memory 30 may be a DRAM chip. Further, in some embodiments, the DRAM chip conforms to the memory specification of DDR5.

The embodiments of the present disclosure mainly relate to a control method and a related control circuit for the DM pin of the semiconductor memory. The relation between the control signal configured to control whether the DM pin is enabled in the DDR5 and the control signal configured to control whether the DM pin is the test object in the PODTM is specified. The impedance of the DM pin may be tested in the preset test mode to avoid the circuit processing errors.

The above are only the preferred embodiments of the present disclosure, and are not intended to limit the scope of protection of the present disclosure. It is to be noted that in this disclosure, the terms "including", "containing" or any other variation thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "including a . . . " does not exclude the existence of other identical elements in the process, method, article, or device including the element. The above numbers of the embodiments of the present disclosure are only for description, and do not represent the advantages or disadvantages of the embodiments. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiment. The features disclosed in several method or device embodiments provided in the present disclosure may be combined arbitrarily without conflict to obtain new method embodiments or device embodiments. The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure. Therefore, the scope of protection of the present disclosure shall be subject to the scope of protection of the claims.

INDUSTRIAL APPLICABILITY

Embodiments of the present disclosure provide a control method, a semiconductor memory, and an electronic device. The relation between a control signal configured to control whether the DM pin is enabled in the DDR5 and a control signal configured to control whether the DM pin is a test object in the PODTM is specified. The impedance of the DM pin may be tested in the preset test mode to avoid circuit processing errors.

The invention claimed is:

1. A control method, applied to a semiconductor memory comprising a Data Mask (DM) pin, the DM pin being configured to receive an input mask signal of write data, the method comprising:
   decoding a third Operand (OP) in a third Mode Register (MR) and a fourth OP in a first MR; and
   in response to the semiconductor memory being in a preset test mode, controlling, in a case where the third OP meets a first decoding condition, an impedance of the DM pin to be a first value, or controlling, in a case where the third OP meets a second decoding condition, the impedance of the DM pin to be a second value according to the fourth OP,
   wherein the third OP is configured to indicate whether the DM pin is a test object in the preset test mode, and the fourth OP is configured to indicate whether the DM pin is enabled.

2. The control method of claim 1, wherein the first value is a first impedance parameter, and the first decoding condition indicates that the DM pin is the test object in the preset test mode; the controlling an impedance of the DM pin to be a first value comprises:
   decoding a first OP in the first MR, and controlling the impedance of the DM pin to be the first impedance parameter according to a decoding result,
   wherein the semiconductor memory further comprises at least one Data (DQ) pin, the DQ pin is configured to receive or output data, and the first OP is configured to indicate that the impedance of the at least one DQ pin in an output driver state is the first impedance parameter.

3. The control method of claim 2, wherein the second value comprises a second impedance parameter and a high impedance state, and the second decoding condition indicates that the DM pin is not the test object in the preset test mode; the controlling the impedance of the DM pin to be a second value according to the fourth OP comprises:
   decoding a second OP in a second MR in a case where the fourth OP meets a third decoding condition, and controlling the impedance of the DM pin to be the second impedance parameter according to a decoding result, the third decoding condition indicating that the DM pin is enabled; and
   controlling, in a case where the fourth OP meets a fourth decoding condition, the impedance of the DM pin to be in the high impedance state through a first fixed level signal, the fourth decoding condition indicating that the DM pin is disabled,
   wherein the second OP is configured to indicate that the impedance of the at least one DQ pin in a termination state is the second impedance parameter.

4. The control method of claim 3, further comprising:
   acquiring the first OP and the fourth OP stored in the first MR, the second OP stored in the second MR and the third OP stored in the third MR;
   decoding the third OP and the fourth OP respectively to obtain a first test flag signal and an enable control signal; and
   when the semiconductor memory is in the preset test mode, controlling, in a case where the first test flag signal is in a first level state, the impedance of the DM pin through the first OP, or, selecting, in a case where the first test flag signal is in a second level state, the second OP or the first fixed level signal according to a level state of the enable control signal to control the impedance of the DM pin,
   wherein when the third OP meets the first decoding condition, the first test flag signal is in the first level state; when the third OP meets the second decoding condition, the first test flag signal is in the second level state; when the fourth OP meets the third decoding condition, the enable control signal is in the first level state; and when the fourth OP meets the fourth decoding condition, the enable control signal is in the second level state.

5. The control method of claim 1, wherein the first value is a second impedance parameter, and the first decoding condition indicates that the DM pin is not the test object in the preset test mode; the controlling an impedance of the DM pin to be a first value comprises:
   decoding a second OP in the second MR, and controlling the impedance of the DM pin to be a second impedance parameter according to a decoding result, wherein the semiconductor memory further comprises at least one DQ pin, the DQ pin is configured to receive or output data, and the second OP is configured to indicate that an impedance of the at least one DQ pin in a termination state is the second impedance parameter.

6. The control method of claim 5, wherein the second value comprises a first impedance parameter and a high impedance state, the second decoding condition indicating that the DM pin is the test object in the preset test mode; the controlling the impedance of the DM pin to be a second value according to the fourth OP comprises:
decoding a first OP in the first MR in a case where the fourth OP meets a third decoding condition, and controlling the impedance of the DM pin to be the first impedance parameter according to a decoding result, the third decoding condition indicating that the DM pin is enabled; and
controlling, in a case where the fourth OP meets a fourth decoding condition, the impedance of the DM pin to be in the high impedance state through a first fixed level signal, the fourth decoding condition indicating that the DM pin is disabled,
wherein the first OP is configured to indicate that the impedance of the at least one DQ pin in an output driver state is the first impedance parameter.

7. The control method of claim 6, further comprising:
acquiring the first OP and the fourth OP stored in the first MR, the second OP stored in the second MR and the third OP stored in the third MR;
decoding the third OP and the fourth OP respectively to obtain a first test flag signal and an enable control signal; and
when the semiconductor memory is in the preset test mode, controlling, in a case where the first test flag signal is in a second level state, the impedance of the DM pin through the second OP; or, selecting, in a case where the first test flag signal is in a first level state, the first OP or the first fixed level signal according to a level state of the enable control signal to control the impedance of the DM pin,
wherein when the third OP meets the first decoding condition, the first test flag signal is in the second level state; when the third OP meets the second decoding condition, the first test flag signal is in the first level state; when the fourth OP meets the third decoding condition, the enable control signal is in the first level state; and when the fourth OP meets the fourth decoding condition, the enable control signal is in the second level state.

8. The control method of claim 4, further comprising:
determining a first non-test state control signal and a second impedance control signal;
when the semiconductor memory is in the preset test mode, outputting a first impedance control signal based on one of the first fixed level signal, the first OP and the second OP according to a level state of the first test flag signal and a level state of the enable control signal; or, when the semiconductor memory is not in the preset test mode, outputting the first impedance control signal based on the first non-test state control signal; and
selecting one of the first impedance control signal and the second impedance control signal according to a working state of the semiconductor memory to control the impedance of the DM pin,
wherein the first non-test state control signal is configured to indicate the impedance of the DM pin in a state other than the preset test state, and the second impedance control signal is configured to indicate the impedance of the DQ pin in the output driver state; or the first non-test state control signal is configured to indicate the impedance of the DQ pin in the output driver state, and the second impedance control signal is configured to indicate the impedance of the DM pin in the state other than the preset test state.

9. The control method of claim 4, wherein the preset test mode is a Package Output Driver Test Mode (PODTM), and the PODTM is configured to test the impedance of the DM pin or the at least one DQ pin after packaging;
a standard number of each first MR is 5, the first OP is an OP from the second bit to the first bit stored in the first MR, and the fourth OP is an OP at the fifth bit stored in the first MR; the standard number of the second MR is 34, and the second OP is an OP from the second bit to the 0th bit stored in the third MR; the standard number of the third MR is 61, and the third OP is an OP from the 4th bit to the 0th bit stored in the third MR; and
the first level state is a high level state, and the second level state is a low level state.

10. A semiconductor memory, comprising a Data Mask (DM) pin, a first Model Register (MR), a third MR, and a first driver circuit, the first driver circuit being connected with the first MR, the third MR and the DM pin respectively,
wherein the DM pin is configured to receive an input mask signal of write data;
the first driver circuit is configured to decode a third Operand (OP) in the third MR and a fourth OP in the first MR; and control, in a case where the third OP meets a first decoding condition, an impedance of the DM pin to be a first value in response to the semiconductor memory being in a preset test mode; or control, in a case where the third OP meets a second decoding condition, the impedance of the DM pin to be a second value according to the fourth OP;
wherein the third OP is configured to indicate whether the DM pin is a test object in the preset test mode, and the fourth OP is configured to indicate whether the DM pin is enabled.

11. The semiconductor memory of claim 10, wherein the first decoding condition indicates that the DM pin is the test object in the preset test mode, and the first value is a first impedance parameter;
the first driver circuit is further configured to decode a first OP in the first MR in a case where the third OP meets a first decoding condition, and control the impedance of the DM pin to be the first impedance parameter according to a decoding result;
wherein the semiconductor memory further comprises at least one Data (DQ) pin, the DQ pin is configured to receive or output data, and the first OP is configured to indicate that the impedance of the at least one DQ pin in an output driver state is the first impedance parameter.

12. The semiconductor memory of claim 11, wherein the second decoding condition indicates that the DM pin is not the test object in the preset test mode, and the second value comprises a high impedance state and a second impedance parameter; the semiconductor memory further comprises a second MR, the second MR being connected to the first driver circuit,
wherein the first driver circuit is further configured to decode a second OP in the second MR in a case where the third OP meets the second decoding condition and the fourth OP meets a third decoding condition, and control the impedance of the DM pin to be the second impedance parameter according to the decoding result; or, control, in a case where the third OP meets the second decoding condition and the fourth OP meets a fourth decoding condition, the DM pin to be in the high impedance state through a first fixed level signal; and wherein the third decoding condition indicates that the DM pin is enabled, and the fourth decoding condition indicates that the DM pin is disabled; and the second OP is configured to indicate that the impedance of the at least one DQ pin in a termination state is the second impedance parameter.

13. The semiconductor memory of claim 10, wherein the first decoding condition indicates that the DM pin is not the test object in the preset test mode, the second decoding condition indicates that the DM pin is the test object in the preset test mode, the first value is a second impedance parameter, and the second value comprises a first impedance parameter and a high impedance state;
the semiconductor memory further comprises a second MR, the second MR being connected to the first driver circuit,
wherein the first driver circuit is specifically configured to decode a second OP in the second MR in a case where the third OP meets the first decoding condition, and control the impedance of the DM pin to be the second impedance parameter according to a decoding result; or, decode a first OP in the first MR in a case where the third OP meets the second decoding condition and the fourth OP meets a third decoding condition, and control the impedance of the DM pin to be the first impedance parameter according to a decoding result; or, control, in a case where the third OP meets the second decoding condition and the fourth OP meets a fourth decoding condition, the impedance of the DM pin to be in the high impedance state through a first fixed level signal; and
wherein the third decoding condition indicates that the DM pin is enabled, and the fourth decoding condition indicates that the DM pin is disabled.

14. The semiconductor memory of claim 12, wherein the semiconductor memory further comprises a first decoding circuit and a second decoding circuit; wherein
the first MR is configured to store and output the first OP and the fourth OP;
the second MR is configured to store and output the second OP;
the third MR is configured to store and output the third OP;
the first decoding circuit is configured to receive the third OP, decode the third OP and output a first test flag signal;
the second decoding circuit is configured to receive the fourth OP, decode the fourth OP and output an enable control signal;
the first driver circuit is configured to receive the first test flag signal, the enable control signal, the first fixed level signal, the first OP and the second OP; and control, in a case where the first test flag signal is in a first level state, the impedance of the DM pin through the first OP when the semiconductor memory is in the preset test mode; or select, in a case where the first test flag signal is in a second level state, the second OP or the first fixed level signal according to a level state of the enable control signal to control the impedance of the DM pin, wherein when the third OP meets the first decoding condition, the first test flag signal is in the first level state; when the third OP meets the second decoding condition, the first test flag signal is in the second level state; when the fourth OP meets the third decoding condition, the enable control signal is in the first level state; and when the fourth OP meets the fourth decoding condition, the enable control signal is in the second level state.

15. The semiconductor memory of claim 14, wherein the semiconductor memory is further configured to determine a first non-test state control signal, a second impedance control signal and a first calibration signal; wherein the first calibration signal is configured to calibrate a pull-up resistance value; the first driver circuit comprises:
a first signal processing circuit, configured to receive the first test flag signal, the enable control signal, the first fixed level signal, the first OP, the second OP and the first non-test state control signal; and output, based on one of the first fixed level signal, the first OP and the second OP, a first impedance control signal according to a level state of the first test flag signal and a level state of the enable control signal; or, output the first impedance control signal based on the first non-test state control signal when the semiconductor memory is not in the preset test mode;
a first logic circuit, configured to receive the first impedance control signal, the second impedance control signal and the first calibration signal; and select and logically combine the first impedance control signal, the second impedance control signal and the first calibration signal to output a first target signal; and
a first driver, comprising a plurality of first impedance circuits and configured to receive the first target signal, and control the plurality of first impedance circuits using the first target signal, so as to control the impedance of the DM pin;
wherein the first non-test state control signal is configured to indicate the impedance of the DM pin in the state other than the preset test state, and the second impedance control signal is configured to indicate the impedance of the DQ pin in the output driver state; or, the first non-test state control signal is configured to indicate the impedance of the DQ pin in the output driver state, and the second impedance control signal is configured to indicate the impedance of the DM pin in the state other than the preset test state.

16. The semiconductor memory of claim 15, wherein the first signal processing circuit comprises:
a third decoding circuit, configured to receive the first OP, decode the first OP and output a first decoded signal;
a fourth decoding circuit, configured to receive the second OP, decode the second OP and output a second decoded signal;
a first selection circuit, configured to receive the enable control signal, the second decoded signal and the first fixed level signal; and select one of the second decoded signal and the first fixed level signal according to a level state of the enable control signal to output a first preselection signal;
a second selection circuit, configured to receive the first test flag signal, the first preselection signal and the first decoded signal; and select one of the first preselection signal and the first decoded signal according to the level state of the first test flag signal to output the first test state control signal; and a third selection circuit, configured to receive the test enable signal, the first test state control signal and the first non-test state control signal; and select one of the first test state control signal and the first non-test state control signal according to a level state of the test enable signal to output the first impedance control signal, wherein the test enable signal is configured to indicate whether the semiconductor memory is in the preset test mode.

17. The semiconductor memory of claim 16, wherein each of the first decoded signal, the second decoded signal, the first preselection signal, the first fixed level signal, the first test state control signal, the first non-test state control signal and the first impedance control signal comprises M+1 bits of sub-signals, the first selection circuit comprises M+1 first data selectors, the second selection circuit comprises M+1 second data selectors, and the third selection circuit comprises M+1 third data selectors;

wherein an input terminal of one of the first data selectors respectively receives one bit of sub-signal of the second decoded signal and one bit of sub-signal of the first fixed level signal, an output terminal of the one of the first data selectors is configured to output one bit of sub-signal of the first preselection signal, and control terminals of all the first data selectors receive the enable control signal;

an input terminal of one of the second data selectors receives the one bit of sub-signal of the first preselection signal and one bit of sub-signal of the first decoded signal, an output terminal of the one of the second data selectors is configured to output one bit of sub-signal of the first test state control signal, and control terminals of all the second data selectors receive the first test flag signal;

an input terminal of one of the third data selectors receives the one bit of sub-signal of the first test state control signal and one bit of sub-signal of the first non-test state control signal, an output terminal of the one of the third data selectors is configured to output one bit of sub-signal of the first impedance control signal, and control terminals of all the third data selectors receive the test enable signal;

wherein M is a positive integer.

18. The semiconductor memory of claim 17, wherein the second impedance control signal comprises M+1 bits of sub-signals, the first calibration signal comprises N bits of sub-signals, the first target signal comprises a number A of groups of sub-signals, and each group of sub-signals comprises N bits of sub-signals; the first driver comprises a number A of first impedance circuits, and each first impedance circuit is configured to receive a group of sub-signals in the first target signal;

the first logic circuit is specifically configured to determine whether the level pull-up function of the at least one first impedance circuit is enabled according to the first impedance control signal and the second impedance control signal; and determine, in a case where the level pull-up function of an a-th first impedance circuit is enabled, the level state of the a-th group of sub-signals in the first target signal according to the first calibration signal, so as to control a resistance value of the a-th first impedance circuit to be a standard resistance value; or, determine, in a case where the level pull-up function of the a-th first impedance circuit is disabled, that the a-th group of sub-signals in the first target signal are in the first level state;

wherein a, N and A are all integers, a is less than or equal to A, and M+1 is less than or equal to A.

19. The semiconductor memory of claim 18, wherein each first impedance circuit comprises N first switching transistors, N second switching transistors and 2N first resistors;

a control terminal of an n-th first switching transistor in the a-th first impedance circuit is connected with an n-th bit of sub-signal in the a-th group of sub-signals in the first target signal, a first terminal of one of the first switching transistors is connected with a first terminal of one of the first resistors, and a second terminal of the one of the first switching transistors is connected with a power signal;

a control terminal of one of the second switching transistors is connected with a second fixed level signal, a first terminal of the one of the second switching transistors is connected with a ground signal, a second terminal of the one of the second switching transistors is connected with the first terminal of one of the first resistors, and second terminals of the 2N first resistors are all connected with the DM pin;

wherein n is an integer, and n is less than or equal to N, and wherein the first switching transistor is a P-channel field effect transistor, and the second switching transistor is an N-channel field effect transistor; a control terminal of the P-channel field effect transistor is a gate, a second terminal of the P-channel field effect transistor is a source, a first terminal of the P-channel field effect transistor is a drain, a control terminal of the N-channel field effect transistor is a gate, the second terminal of the N-channel field effect transistor is a drain, and the first terminal of the N-channel field effect transistor is a source;

the first level state is a high level state, the second level state is a low level state, the sub-signals in the first fixed level signal are all high-level signals, and the sub-signals in the second fixed level signals are low-level signals; and the standard resistance values are all 240 ohms.

20. An electronic device, comprising a semiconductor memory that comprises a Data Mask (DM) pin, a first Model Register (MR), a third MR, and a first driver circuit, the first driver circuit being connected with the first MR, the third MR and the DM pin respectively, wherein the DM pin is configured to receive an input mask signal of write data;

the first driver circuit is configured to decode a third Operand (OP) in the third MR and a fourth OP in the first MR; and control, in a case where the third OP meets a first decoding condition, an impedance of the DM pin to be a first value in response to the semiconductor memory being in a preset test mode; or control, in a case where the third OP meets a second decoding condition, the impedance of the DM pin to be a second value according to the fourth OP;

wherein the third OP is configured to indicate whether the DM pin is a test object in the preset test mode, and the fourth OP is configured to indicate whether the DM pin is enabled.

* * * * *